United States Patent
Takeuchi et al.

(10) Patent No.: US 8,901,573 B2
(45) Date of Patent: Dec. 2, 2014

(54) SILICON CARBIDE SEMICONDUCTOR DEVICE AND METHOD OF MANUFACTURING THE SAME

(75) Inventors: Yuichi Takeuchi, Obu (JP); Naohiro Suzuki, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/129,998

(22) PCT Filed: Aug. 8, 2012

(86) PCT No.: PCT/JP2012/005040
§ 371 (c)(1),
(2), (4) Date: Dec. 30, 2013

(87) PCT Pub. No.: WO2013/021636
PCT Pub. Date: Feb. 14, 2013

(65) Prior Publication Data
US 2014/0145212 A1    May 29, 2014

(30) Foreign Application Priority Data

Aug. 10, 2011 (JP) ................... 2011-174774

(51) Int. Cl.
*H01L 29/15* (2006.01)
*H01L 21/336* (2006.01)
(Continued)

(52) U.S. Cl.
CPC .............. *H01L 21/265* (2013.01); *H01L 29/78* (2013.01); *H01L 27/098* (2013.01);
(Continued)

(58) Field of Classification Search
CPC .............. H01L 29/78; H01L 29/66068; H01L 29/66909; H01L 29/063; H01L 29/0661; H01L 29/1608; H01L 29/8083; H01L 29/0619; H01L 29/0696; H01L 29/0638; H01L 29/1025; H01L 29/1066; H01L 21/265; H01L 21/0465; H01L 21/337; H01L 21/338; H01L 27/098; H01L 27/156; H01L 27/1446
USPC ............ 257/77, 330, 331; 438/454, 186, 286, 438/270, 589, 931
See application file for complete search history.

(56) References Cited

U.S. PATENT DOCUMENTS

2003/0162355 A1    8/2003    Sankin et al.
2005/0151158 A1    7/2005    Kumar et al.
(Continued)

FOREIGN PATENT DOCUMENTS

JP    2009-302091 A    12/2009
JP    2010-225615 A    10/2010

OTHER PUBLICATIONS

International Search Report of the International Searching Authority mailed Oct. 16, 2012 for the corresponding international application No. PCT/JP2012/00005040 (with English translation).
(Continued)

*Primary Examiner* — Nikolay Yushin
(74) *Attorney, Agent, or Firm* — Posz Law Group, PLC

(57) ABSTRACT

A semiconductor device includes a silicon carbide semiconductor substrate, a transistor formed in a cell region of the semiconductor substrate, and a voltage-breakdown-resistant structure formed in a region which surrounds an outer periphery of the cell region. The semiconductor substrate includes a first conductivity type substrate, a first conductivity type drift layer on the first conductivity type substrate, a second conductivity type layer on the drift layer, and a first conductivity type layer on the second conductivity type layer. The voltage-breakdown-resistant structure includes a first recess which surrounds the outer periphery of the cell region and reaches the drift layer, a trench located at a side surface of the recess on an inner periphery of the recess, and a second conductivity type buried layer buried in the trench to provide the side surface of the first recess.

22 Claims, 16 Drawing Sheets

(51) Int. Cl.
| | | |
|---|---|---|
| *H01L 21/265* | (2006.01) | |
| *H01L 29/78* | (2006.01) | |
| *H01L 27/098* | (2006.01) | |
| *H01L 29/66* | (2006.01) | |
| *H01L 29/06* | (2006.01) | |
| *H01L 29/16* | (2006.01) | |
| *H01L 21/04* | (2006.01) | |
| *H01L 29/808* | (2006.01) | |
| *H01L 29/10* | (2006.01) | |

(52) U.S. Cl.
CPC ... *H01L 29/66068* (2013.01); *H01L 29/66909* (2013.01); *H01L 29/063* (2013.01); *H01L 29/0661* (2013.01); *H01L 29/1608* (2013.01); *H01L 21/0465* (2013.01); *H01L 29/8083* (2013.01); *H01L 29/0619* (2013.01); *H01L 29/0638* (2013.01); *H01L 29/0696* (2013.01); *H01L 29/1025* (2013.01); *H01L 29/1066* (2013.01)
USPC .......................................... 257/77; 436/270

(56) References Cited

U.S. PATENT DOCUMENTS

| | | | |
|---|---|---|---|
| 2005/0258454 | A1 | 11/2005 | Kumar et al. |
| 2009/0200559 | A1 | 8/2009 | Suzuki et al. |

OTHER PUBLICATIONS

Written Opinion of the International Searching Authority mailed Oct. 16, 2012 for the corresponding international application No. PCT/JP2012/00005040 (with English translation).

US 8,901,573 B2

SILICON CARBIDE SEMICONDUCTOR DEVICE AND METHOD OF MANUFACTURING THE SAME

CROSS REFERENCE TO RELATED APPLICATION

This present disclosure is a U.S. national stage application of International Patent Application No. PCT/JP2012/005040 filed on Aug. 8, 2012, and is based on Japanese Patent Application No. 2011-174774 filed on Aug. 10, 2011, the contents of which are incorporated herein by reference.

TECHNICAL FIELD

The present disclosure relates to a silicon carbide (hereinafter referred to as SiC) semiconductor device having an outer voltage-breakdown-resistant region around a transistor cell region where JFET cells, MOSFET cells, or the like are formed, and also relates to a method of manufacturing the same.

BACKGROUND ART

A SiC semiconductor device including a JFET having a trench structure has been known (refer to, for example, patent document 1). In the SiC semiconductor device, an $N^-$-type drift layer, a $P^+$-type first gate region, and an $N^+$-type source region are formed in turn on an $N^+$-type SiC substrate, a trench penetrating these is formed, and then an $N^-$-type channel layer and a $P^+$-type second gate region are formed in the trench. A gate voltage applied to a gate electrode electrically connected to the second gate region is controlled so that a drain current can flow between a source electrode electrically connected to the $N^+$-type source region and a drain electrode electrically connected to the $N^+$-type SiC substrate.

It can be considered that when an outer voltage-breakdown-resistant structure is formed in such a SiC semiconductor device as described above, a mesa structure is formed by forming a recess in an outer region around a transistor cell region where a JFET is formed, and then a P-type RESURF layer or a P-type guard ring layer is formed at a boundary of the recess. Although the P-type RESURF layer or the P-type guard ring layer is formed by selective ion implantation of P-type impurities after the recess is formed, the following problem occurs. This problem is described with reference to FIGS. 18A and 18B.

FIGS. 18A and 18B are cross sectional diagrams illustrating a process of forming a P-type RESURF layer as an outer voltage-breakdown-resistant structure. As shown in the drawings, a JFET basic structure is formed by forming an $N^-$-type drift layer J2, a $P^+$-type first gate region J3, and an $N^+$-type source region J4 are formed in turn on an $N^+$-type SiC substrate J1, forming a trench J5 penetrating these, and then forming an $N^-$-type channel layer J6 and a $P^+$-type second gate region J7 are formed in the trench J5. Then, a recess J8 deeper than the $N^+$-type source region J3 is formed by selective etching using a mask. Then, a recess J9 deeper than the first gate region J3 is formed by selective etching using another mask. Then, a P-type RESURF layer J10 is formed by selective ion implantation of P-type impurities.

At this time, it can be considered that the P-type RESURF layer J10 can be formed by a normal ion implantation in which ion implantation of P-type impurities are performed in a direction normal to a substrate surface as shown in FIG. 18A or by an inclined ion implantation in which ion implantation of P-type impurities are performed in a direction inclined at a predetermined angle with respect to the direction normal to the substrate surface as shown in FIG. 18B.

However, when the ion implantation is performed in the direction normal to the substrate surface, the P-type RESURF layer J10 is not formed at a side surface of the recess J9 and at a corner portion that defines a boundary between the side surface and a bottom surface of the recess J9. Since the first gate region J3 and the P-type RESURF layer J10 are spaced from each other on the side surface of the recess J9, a drain breakdown voltage at the time of OFF is greatly reduced to, for example, 400V or less. That is, since the P-type RESURF layer J10 does not exist at the corner portion of the recess J9, electric field concentration occurs at this portion so that the drain breakdown voltage can be reduced.

On the other hand, when the inclined ion implantation is performed, the P-type RESURF layer J10 is formed at the side surface and the corner portion of the recess J9. Therefore, the drain breakdown voltage at the time of OFF can be increased to, for example, about 1300V. However, since there is a need to perform the inclined ion implantation in four directions in turn around the transistor cell region where the JFET is formed, an ion implantation process becomes complicated and consumes time. As a result, a manufacturing cost of the device is increased.

In the above explanation, the P-type RESURF layer J10 is formed as an outer voltage-breakdown-resistant structure. However, this is not limited to the P-type RESURF layer J10, and the same is true for when a P-type guard ring is formed.

PRIOR ART

Patent Document

Patent Document 1: JP-A-2005-150352

SUMMARY OF THE INVENTION

In view of the above, it is an object of the present disclosure to provide a SiC semiconductor having an outer voltage-breakdown-resistant structure, which is formed without inclined ion implantation and surrounds an outer periphery of a transistor cell region where JFET or the like is formed, to achieve a high drain breakdown voltage.

According to a first aspect of the present disclosure, an outer voltage-breakdown-resistant structure formed in an outer voltage-breakdown-resistant structure region includes a first recess, a first trench, and an electric field relief structure. The first recess surrounds an outer periphery of a transistor cell region and is deeper than a first conductivity layer and a second conductivity layer to reach a drift layer. The first trench is located at a side surface of the first recess on an inner periphery of the first recess and surrounds the outer periphery of the transistor cell region. The electric field relief structure has a second conductivity type buried layer. The second conductivity type buried layer is buried in the first trench and provides the side surface of the first recess.

Since the side surface of the first recess is provided by the second conductivity type buried layer to provide the electric field relief structure, electric field concentration at a corner which defines a boundary between the side surface and a bottom surface is relieved. Therefore, a breakdown position is shifted to the drift layer on the bottom surface of the first recess. Thus, electric field is relieved so that a drain breakdown voltage can be improved. Since the structure is formed by burying the second conductivity type buried layer in the first trench, there is no need to perform inclined ion implantation. Therefore, the outer voltage-breakdown-resistant structure, which surrounds the outer periphery of the transistor cell region, can be formed without the inclined ion implantation and can achieve a high drain breakdown voltage.

According to a second aspect of the present disclosure, a second recess is included. The second recess is deeper than a thickness of the first conductivity type layer and surrounds the outer periphery of the transistor cell region. The first recess is located farther away from the transistor cell region than the second recess and deeper than the second recess. The first trench is located at a boundary between the first recess and the second recess.

As described above, when the second recess is formed, it is preferable that the first recess be located farther away from the transistor cell region than the second recess.

According to a third aspect of the present disclosure, another second conductivity type layer is formed on a near side of a bottom surface of the second recess to the first recess and on a near side of the bottom surface of the first recess to the second recess. The other conductivity type layer is joined to the second conductivity type buried layer to form a second conductivity type RESURF layer which provides the electric field relief structure.

Since the other second conductivity type layer on the near side of the bottom surface of the second recess to the first recess and the other second conductivity type layer on the near side of the bottom surface of the first recess to the second recess are continuously joined together to form the P-type RESURF layer 20, an ideal drain breakdown voltage at the time of OFF can be ensured.

According to a fourth aspect of the present disclosure, multiple first trenches are arranged outwardly from the boundary between the first recess and the second recess, and the second conductivity type buried layer is formed in each of the first trenches to form a guard ring structure which provides the electric field relief structure.

As described above, the guard ring structure is formed by the second conductivity type buried layer buried in each of the first trenches. Even when such a guard ring structure is formed, the second conductivity type buried layer can be located at the side surface of the first recess by using the first trench and the second conductivity type buried layer. Thus, the same advantages as the third aspect can be obtained.

According to a fifth aspect of the present disclosure, multiple first trenches are arranged inwardly from the boundary between the first recess and the second recess, and the second conductivity type buried layer is formed in each of the first trenches to form a guard ring structure which provides the electric field relief structure.

In this way, the guard ring structure can be formed inside the boundary between the first recess and the second recess. In this case, when the second conductivity type buried layer is formed on a first conductivity type buried layer in the first trench, the guard ring structure formed in the second recess has the first trench, the first conductivity type buried layer, and the second conductivity type buried layers. Thus, the second conductivity layer is located between the first trenches. Not only the second conductivity type buried layer, but also the second conductivity type layer serves as the guard ring structure, and a distance between these becomes equal to a thickness of the first conductivity type buried layer only. Accordingly, electric field in the guard ring structure is reduced so that a stable drain breakdown voltage can be easily ensured.

According to a sixth aspect of the present disclosure, the first trenches are arranged in descending order of their width in an outward direction of the transistor cell region.

As described above, the first trenches can be arranged in descending order of their width in the outward direction of the transistor cell region. In this case, when a first or second conductivity buried layer having an impurity concentration lower than that of the first conductivity buried layer or the second conductivity buried layer is formed before the second conductivity type buried layer is formed in each of the first trenches, depths of the second conductivity buried layers can gradually decrease. In such a structure, the electric field is further relieved at the time of OFF. Thus, compared to when the second conductivity buried layers have the same depth, even when the size of the outer voltage-breakdown-resistant structure region is small, the same or higher drain breakdown voltage can be ensured.

According to a seventh aspect of the present disclosure, a JFET is formed in the transistor cell region. The JFET includes a first gate region, a source region, a second trench, a first conductivity type channel layer, a second conductivity type second gate region, a source electrode, and a drain electrode. The first gate region is provided by the second conductivity type layer. The source region is provided by the first conductivity type layer. The second trench reaches the drift layer by penetrating the first conductivity type layer and the second conductivity type layer. The channel layer is formed by epitaxial growth on an inner wall of the second trench. The second gate region is formed on the channel layer. The source electrode is electrically connected to the first conductivity type layer. The drain electrode is electrically connected to a first conductivity type substrate. A source-to-drain current is controlled by controlling a potential of at least one of the first gate region and the second gate region.

As described above, the present disclosure can be applied to a SiC semiconductor device having a JFET in the transistor cell region. In this case, the first trench and the second conductivity type buried layer can be formed by using processes in which the second trench, the channel layer, and the second gate region are formed. In this way, since a manufacturing process is commonly used, the electric field relief structure can be formed without an increase in the manufacturing process.

According to an eighth aspect of the present disclosure, the first trench and the second trench have the same depth, and the second conductivity type buried layer is formed on a first conductivity type buried layer in the first trench.

According to a ninth aspect of the present disclosure, a MOSFET is formed in the transistor cell region. The MOSFET includes a base region, a source region, a gate insulating layer, a gate electrode, a source electrode, a drain electrode, a second trench, and a second conductivity type deep layer. The base region is provided by the second conductivity type layer. The source region is provided by the first conductivity type layer. The gate insulating layer is formed on a surface of the base region between the source region and the drift layer. The gate electrode is formed on a surface of the gate insulating layer. The source electrode is electrically connected to the first conductivity type layer. The drain electrode is electrically connected to a first conductivity type substrate. The second trench reaches the drift layer by penetrating the first conductivity type layer and the second conductivity type layer. The second conductivity type deep layer is buried in the second trench. A source-to-drain current is controlled by controlling a potential of the gate electrode.

As described above, the present disclosure can be applied to a SiC semiconductor device having a MOSFET in the transistor cell region. In this case, the first trench and the second conductivity type buried layer can be formed by using processes in which the second trench and the deep layer are formed. In this way, since a manufacturing process is commonly used, the electric field relief structure can be formed without an increase in the manufacturing process.

According to a tenth aspect of the present disclosure, the first trench and the second trench have the same depth.

According to an eleventh aspect of the present disclosure, another trench is formed in the transistor cell region and reaches the drift layer by penetrating the first conductivity type layer and the second conductivity type layer. The gate insulating layer and the gate electrode are formed in the other trench so that the MOSFET has a trench gate structure. The other trench of the trench gate structure is deeper than the second trench.

As described above, the MOSFET formed in the transistor cell region can have a trench gate structure. In this case, the second trench in which the deep layer is buried is deeper than the other trench of the trench gate structure. Thus, the electric field applied to the gate insulating layer at the time of OFF is reduced so that a breakdown of the gate insulating layer can be prevented.

In the second to eleventh aspects described above, the present disclosure is defined as a device. Alternatively, the present disclosure can be defined as a manufacturing method. Twelfth to twenty-second aspects correspond to methods of manufacturing the SiC semiconductor devices of the first to eleventh aspects.

According to a twelfth aspect of the present disclosure, a manufacturing method includes a step of preparing the semiconductor substrate, a step of forming a first trench in the outer voltage-breakdown-resistant structure region in such a manner that the first trench surrounds the outer periphery of the transistor cell region, a step of forming a second conductivity type buried layer in the first trench, and a step of forming a first recess which is deeper than the first conductivity type layer and the second conductivity type layer (3) and reaches the drift layer in such a manner that the first recess surrounds the outer periphery of the transistor cell region. In the step of forming the first recess, the first trench is located at a side surface of the first recess on an inner periphery of the first recess so that the side surface of the first recess is provided by the second conductivity type buried layer to form an electric field relief structure having the second conductivity type buried layer. By this method, the SiC semiconductor device of the first aspect can be manufactured.

According to a thirteenth aspect of the present disclosure, the manufacturing method further includes a step of forming a second recess deeper than a thickness of the first conductivity type layer in such a manner that the second recess surrounds the outer periphery of the transistor cell region. In the step of forming the first recess, the first trench is located at a boundary between the first recess and the second recess so that the side surface of the first recess at the boundary between the first recess and the second recess is provided by the second conductivity type buried layer to form the electric field relief structure having the second conductivity type buried layer. By this method, the SiC semiconductor device of the second aspect can be manufactured.

According to a fourteenth aspect of the present disclosure, the manufacturing method further includes a step of forming a second conductivity layer on a near side of a bottom surface of the second recess to the first recess and on a near side of a bottom surface of the first recess to the second recess in such a manner that the second conductivity layer is joined to the second conductivity type buried layer to form a second conductivity type RESURF layer which provides the electric field relief structure. The step of forming the second conductivity layer follows the step of forming the first recess and the step of forming the second recess and includes a step of forming a mask on a surface of the substrate and a step of performing ion implantation of second conductivity type impurities in a direction normal to the substrate by using the mask.

As described above, the second conductivity type layer is formed by performing ion implantation of second conductivity type impurities in a direction normal to the substrate. By this method, the SiC semiconductor device of the third aspect can be manufactured.

According to a fifteenth aspect of the present disclosure, in the step of forming the first trench, multiple first trenches are formed in such manner that the first trenches are arranged outwardly from the boundary between the first recess and the second recess, and in the step of forming the second conductivity type buried layer, the second conductivity type buried layer is formed in each of the first trenches to form a guard ring structure which provides the electric field relief structure. By this method, the SiC semiconductor device of the fourth aspect can be manufactured.

According to a sixteenth aspect of the present disclosure, in the step of forming the first trench, multiple first trench are formed in such manner that the first trenches are arranged inwardly from the boundary between the first recess and the second recess, and in the step of forming the second conductivity type buried layer, the second conductivity type buried layer is formed in each of the first trenches to form a guard ring structure which provides the electric field relief structure. By this method, the SiC semiconductor device of the fifth aspect can be manufactured.

According to a seventeenth aspect of the present disclosure, in the step of forming the first trench, the first trenches are formed so that the first trenches are arranged in descending order of their width in an outward direction of the transistor cell region. By this method, the SiC semiconductor device of the sixth aspect can be manufactured.

According to an eighteenth aspect of the present disclosure, the manufacturing method further includes a step of forming a JFET in the transistor cell region. The JFET has a first gate region provided by the second conductivity type layer and a source region provided by the first conductivity type layer. The step of forming the JFET includes a step of forming a second trench which reaches the drift layer by penetrating the first conductivity type layer and the second conductivity type layer, a step of forming a first conductivity type channel layer by epitaxial growth on an inner wall of the second trench, a step of forming a second conductivity type second gate region on the channel layer, a step of forming a source electrode electrically connected to the first conductivity type layer, and a step of forming a drain electrode electrically connected to the first conductivity type substrate. A source-to-drain current is controlled by controlling a potential of at least one of the first gate region and the second gate region. By this method, the SiC semiconductor device of the seventh aspect can be manufactured.

According to a nineteenth aspect of the present disclosure, when the JFET is formed in the transistor cell region, the manufacturing method further includes a step of forming a first conductivity type buried layer in the first trench. The step of forming the second conductivity type buried layer is performed after the step of forming the first conductivity type buried layer. The step of forming the first trench and the step of forming the second trench are performed at the same time. The step of forming the first conductivity type buried layer and the step of forming the channel layer are performed at the same time. The step of forming the second conductivity type buried layer and the step of forming the second gate region are performed at the same time. In such an approach, since a manufacturing process is commonly used, the electric field relief structure can be formed without an increase in the manufacturing process.

According to a twentieth aspect of the present disclosure, the manufacturing method further includes a step of forming a MOSFET in the transistor cell region. The MOSFET has a base region provided by the second conductivity type layer and a source region provided by the first conductivity type layer. The step of forming the MOSFET includes a step of forming a second trench which reaches the drift layer by penetrating the first conductivity type layer and the second conductivity type layer, a step of forming a second conductivity type deep layer in the second trench, a step of forming a gate insulating layer on a surface of the base region between the source region and the drift layer, a step of forming a gate electrode on a surface of the gate insulating layer, forming a source electrode electrically connected to the first conductivity type layer, and a step of forming a drain electrode electrically connected to the first conductivity type substrate. A source-to-drain current is controlled by controlling a potential of the gate electrode. By this method, the SiC semiconductor device of the ninth aspect can be manufactured.

According to a twenty-first aspect of the present disclosure, when the MOSFET is formed in the transistor cell region, the step of forming the first trench and the step of forming the second trench are performed at the same time, and the step of forming the second conductivity type buried layer and the step of forming the deep layer are performed at the same time. In such an approach, since a manufacturing process is commonly used, the electric field relief structure can be formed without an increase in the manufacturing process.

According to a twenty-second aspect of the present disclosure, when the MOSFET is formed in the transistor cell region, the manufacturing method further includes a step of forming another trench in the transistor cell region in such a manner that the other trench is deeper than the second trench and reaches the drift layer by penetrating the first conductivity type layer and the second conductivity type layer. The gate insulating layer and the gate electrode are formed in the other trench so that the MOSFET has a trench gate structure. By this method, the SiC semiconductor device of the eleventh aspect can be manufactured.

BRIEF DESCRIPTION OF THE DRAWINGS

The above and other objects, features and advantages of the present disclosure will become more apparent from the following detailed description made with reference to the accompanying drawings. In the drawings.

EMBODIMENTS OF THE INVENTION

Embodiments of the present disclosure are described with reference to the drawings in which like characters of reference indicate the same or equivalent parts.

(First Embodiment)

Figure 1A:
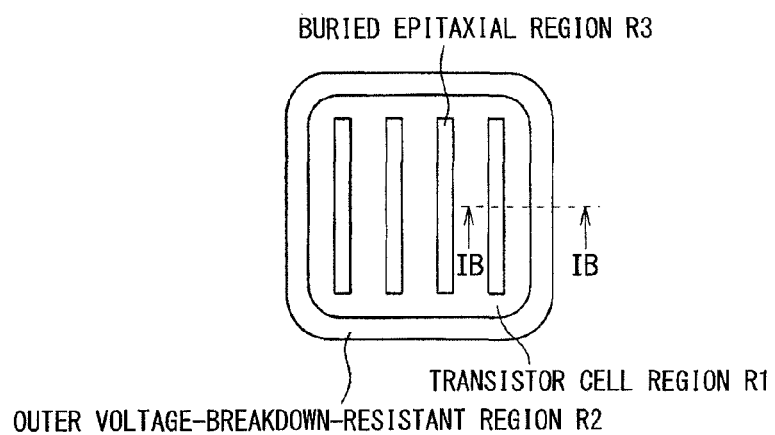
FIG. 1A illustrates a top surface layout view of a SiC semiconductor device having a JFET according to a first embodiment of the present disclosure.
Figure 1B:
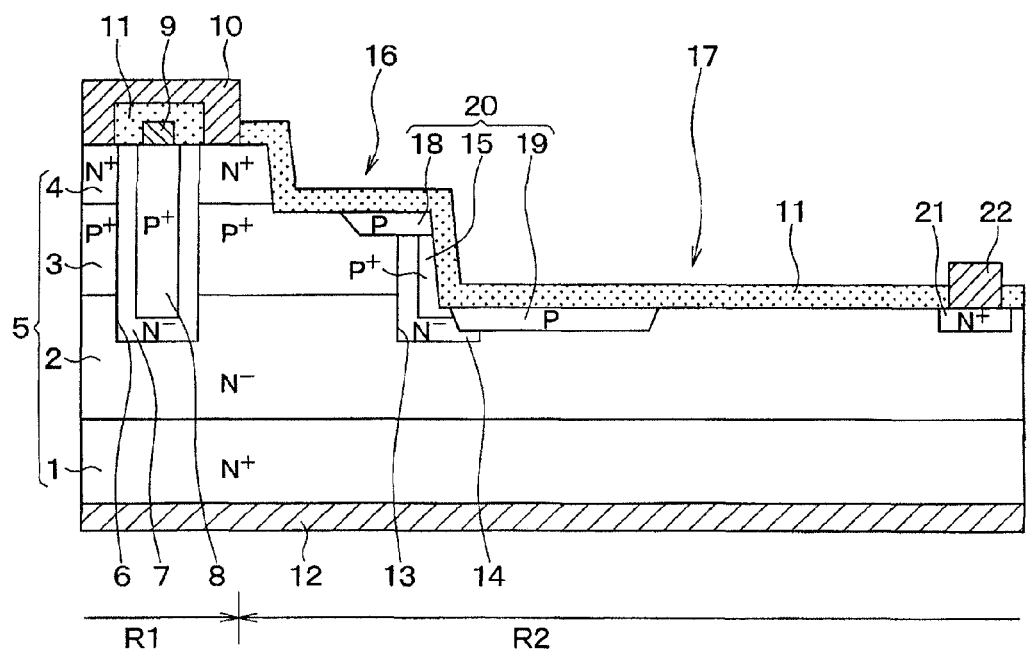
FIG. 1B is a diagram illustrating a cross-sectional view taken along line IB-IB in FIG. 1A.

A SiC semiconductor device having a JFET is explained as an example of a SiC semiconductor device according to a first embodiment of the present disclosure. FIGS. 1A and 1B are diagrams illustrating a SiC semiconductor device having a JFET according to the present embodiment. FIG. 1A illustrates a top surface layout view, and FIG. 1B is a cross-sectional view taken along line IB-IB in FIG. 1A. A structure of the SiC semiconductor device having the JFET according to the present embodiment is described below with reference to these diagrams.

As shown in FIGS. 1A and 1B, the structure includes a transistor cell region (JFET formation region) R1 where JFET cells are formed and an outer voltage-breakdown-resistant structure region R2 located around an outer periphery of the transistor cell region R1. In the transistor cell region R1, buried epitaxial regions R3, which are gate structures formed by filling trenches with epitaxial layers, are arranged in a stripe pattern. The outer voltage-breakdown-resistant structure region R2 surrounds the transistor cell region R1.

The SiC semiconductor device is formed by using a semiconductor substrate 5 having a multilayer structure including an N$^+$-type substrate (a first conductivity-type substrate) 1, an N$^-$-type drift layer 2, a P$^+$-type layer (a second conductivity-type layer) 3, and an N$^+$-type layer (a first conductivity-type layer) 4. For example, the N$^+$-type substrate 1 has an N-type impurity concentration of 1×10$^{19}$ cm$^{-3}$ or more. For example, an N-type impurity concentration of the N$^-$-type drift layer 2 is lower than that of the N$^+$-type substrate 1 and ranges from 1×10$^{15}$ to 5×10$^{16}$ cm$^{-3}$. For example, the P$^+$-type layer 3 has a P-type impurity concentration of from 1×10$^{18}$ to 5×10$^{19}$ cm$^3$. For example, an N-type impurity concentration of the N$^+$-type layer 4 is higher than that of the N$^-$-type drift layer 2 and ranges from 1×10$^{18}$ to 5×10$^{20}$ cm$^{-3}$.

In the SiC semiconductor device, the transistor cell region R1 where a lot of JFET cells are formed is located on the center side of the semiconductor substrate 5, and the outer voltage-breakdown-resistant structure region R2 is located to surround the transistor cell region R1.

A trench 6 is formed on a main surface side of the semiconductor substrate 5 in the transistor cell region R1. The trench 6 reaches the N$^-$-type drift layer 2 by penetrating the N$^+$-type layer 4 and the P$^+$-type layer 3. As shown in FIG. 1A, the trench 6 has a longitudinal direction, and multiple trenches 6 are arranged at predetermined intervals. An N$^-$-type channel layer (a fourth semiconductor layer) 7 is formed by epitaxial growth on an inner surface of each trench 6 and a P$^+$-type layer (a fifth semiconductor layer) 8 is formed by epitaxial growth on the N$^-$-type channel layer 7. For example, the N$^-$-type channel layer 7 has a thickness of 1 μm or less and an N-type impurity concentration of from 5×10$^{15}$ to 1×10$^{17}$ cm$^{-3}$. For example, the P$^+$-type layer 8 has a P-type impurity concentration of from 1×10$^{18}$ to 5×10$^{20}$ cm$^{-3}$. The trench 6 is filled with the N$^-$-type channel layer 7 and the P$^+$-type layer 8 so that the buried epitaxial regions R3 can be formed.

In the transistor cell region R1 where the JFET cells are formed, a first gate region is provided by the P$^+$-type layer 3, a second gate region is provided by the P$^+$-type layer 8, and an N$^+$-type source region is provided by the N$^+$-type layer 4.

Although not shown in the drawings, the P$^+$-type layer 3, which provides the first gate region, is electrically connected to a first gate electrode, and a gate voltage of the first gate region is controlled through the first gate electrode. Further, the P$^+$-type layer 8, which provides the second gate region, is electrically connected to a second gate electrode 9, and a gate voltage of the second gate region is controlled through the second gate electrode 9.

For example, the first gate electrode is formed on a surface of the P$^+$-type layer 3, which provides the first gate region, in such a manner that it appears in cross section different from that shown in FIG. 1B. The first gate electrode is in contact with the P$^+$-type layer 3 through a contact hole. The second gate electrode 9 is formed on a surface of the P$^+$-type layer 8, which provides the second gate region. For example, each of the first gate electrode and the second gate electrode 9 is formed by forming an alloy layer of Ti and Al on Ni, which is a material capable of forming an Ohmic contact with a P$^+$-type semiconductor.

Further, a source electrode 10, which is made from Ni or the like, is formed on a surface of the N$^+$-type layer 4, which provides the N$^+$-type source region. The source electrode 10 is electrically isolated from the first gate electrode and the second gate electrode 9 by an interlayer dielectric 11.

A drain electrode 12 is formed on a back surface side of the semiconductor substrate 5 and electrically connected to the N$^+$-type substrate 1. In this way, the JFET cells are formed in the transistor cell region R1.

A trench (first trench) 13 is formed on the main surface side of the semiconductor substrate 5 in the outer voltage-breakdown-resistant structure region R2. The trench 13 reaches the N$^-$-type drift layer 2 by penetrating the N$^+$-type layer 4 and the P$^+$-type layer 3. The trench 13 surrounds the periphery of the transistor cell region R1 to form a closed loop around the transistor cell region R1. An N$^-$-type layer (a first conductivity type buried layer) 14, which is formed at the same time as the N$^-$-type layer channel layer 7, and a P$^+$-type layer 15 (a second conductivity type buried layer) 15, which is formed at the same time as the P$^+$-type layer 8, are provided in the trench 13. Further, a recess 16 and a recess 17 are formed on the main surface side of the semiconductor substrate 5. The recess 16 is deeper than the thickness of the N$^+$-type layer 4. The recess 17 is located outside the recess 16 and reaches the N$^-$-type drift layer 2 by penetrating the N$^+$-type layer 4 and the P$^+$-type layer 3. The recess 16 corresponds to a second recess, and the recess 17 corresponds to a first recess. In this way, the mesa structure is formed. That is, in the mesa structure, the recess 17 surrounds the transistor cell region R1, and the recess 16 is located inside the recess 17 and surrounds the transistor cell region R1.

A P-type region 18 is formed on an outer edge of a bottom surface of the recess 16, i.e., formed on the near side of the bottom surface of the recess 16 to the recess 17 to surround the transistor cell region R1. For example, the P-type region 18 has a P-type impurity concentration of from 1×10$^{18}$ to 5×10$^{20}$ cm$^{-3}$ (e.g., 5×10$^{18}$ cm$^{-3}$). A P-type region 19 is formed on the near side of a bottom surface of the recess 17 to a boundary between the bottom surface and a side surface of the recess 17, i.e., formed on the near side of the bottom surface of the recess 17 to the recess 16 to surround the transistor cell region R1. For example, the P-type region 19 has a P-type impurity concentration of from 1×10$^{18}$ to 5×10$^{20}$ cm$^{-3}$ (e.g., 5×10$^{18}$ cm$^{-3}$). The trench 13 is located at the boundary (at a step height portion) between the bottom surface and the side surface of the recess 17, and the side surface of the recess 17 is provided by the P$^+$-type layer 15 in the trench 13. Thus, the P-type region 18 on the bottom surface of the recess 16, the P$^+$-type layer 15 in the trench 13, and the P-type region 19 on the bottom surface of the recess 17 are joined together to from a P-type RESURF layer 20. This P-type RESURF layer 20 provides an electric field relief structure.

Further, in the outer voltage-breakdown-resistant structure region R2, an N$^+$-type layer 21 is formed in a surface portion of the N$^-$-type drift layer 2 on the bottom surface of the recess 17. The N$^+$-type layer 21 is located outside the P-type RESURF layer 20 and connected to an electrode 22. The N$^+$-type layer 21 and the electrode 22 provide a channel stopper (EQR) for cutting electric field.

The SiC semiconductor having the JFET according to the present embodiment has a structure as described above.

In the SiC semiconductor having the above structure, the JFET formed in the transistor is normally off. An operation of the JFET is controlled by voltages applied to the first gate electrode and the second gate electrode 9 in the following way.

When the first gate electrode and the second gate electrode 9 are electrically connected to each other so that potentials of these electrodes can be controlled to be the same, or when the first gate electrode and the second gate electrode 9 are electrically disconnected from each other so that the potentials of these electrodes can be separately controlled, a dual-gate drive is performed. That is, the amount of extension of a depletion layer extending from the P$^+$-type layers 3, 8, which provide the first and second gate regions, toward the N$^-$-type channel layer 7 is controlled based on the potentials of the first gate electrode and the second gate electrode 9. For example, when no voltage is applied to the first gate electrode and the second gate electrode 9, the N$^-$-type channel layer 7 is pinched off by the depletion layer extending from the P$^+$-type layers 3, 8. As a result, a source-to-drain current is turned off. Then, when a forward bias is applied between the P$^+$-type layers 3, 8 and the N$^-$-type channel layer 7, the amount of extension of the depletion layer extending toward the N$^-$-type channel layer 7 is reduced. As a result, a channel region is formed so that a source-to-drain current can flow.

Further, in the SiC semiconductor having the above structure, the P-type region 18 on the bottom surface of the recess 16, the P$^+$-type layer 15 in the trench 13, and the P-type region 19 on the recess 17 form the P-type RESURF layer 20 in the outer voltage-breakdown-resistant structure region R2. Since the P-type RESURF layer 20 surrounds the periphery of the transistor cell region R1, electric field concentration at a corner which defines the boundary between the side surface and the bottom surface is relieved. Therefore, a breakdown position is shifted to the N$^-$-type drift layer 2 on the bottom surface of the recess 17. Thus, electric field is relieved so that a drain breakdown voltage can be improved.

Figure 2:
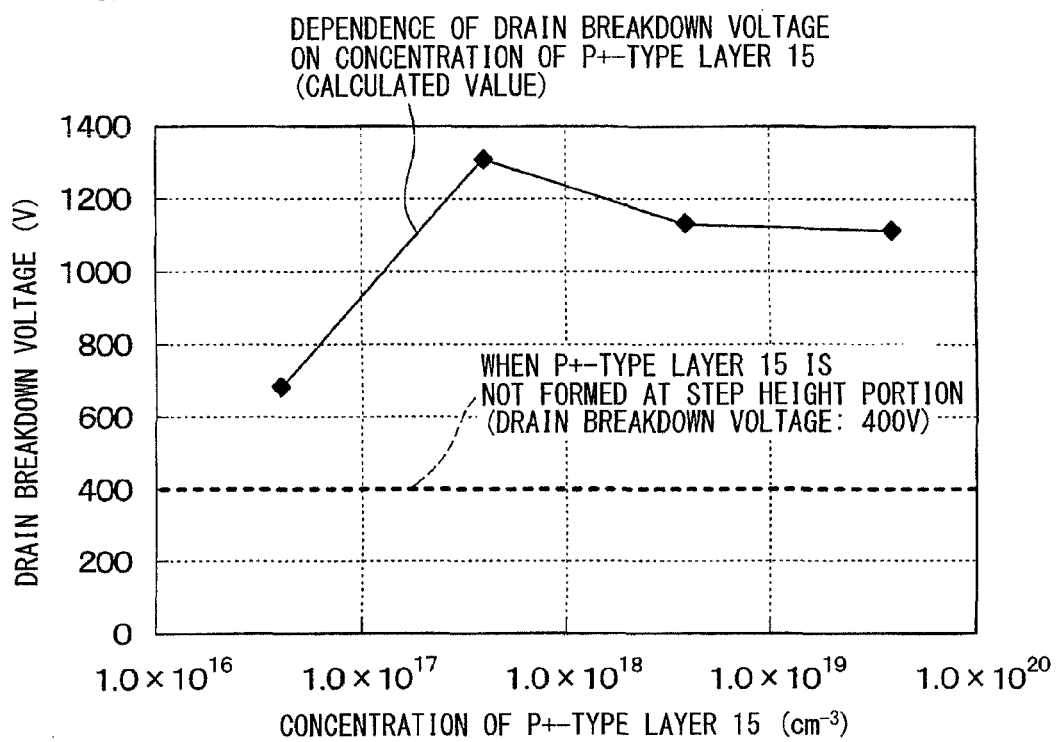
FIG. 2 illustrates a graph showing a result of a measurement of a relationship between an impurity concentration of a P$^+$-type layer 15 and a drain breakdown voltage.

FIG. 2 is a graph showing a result of a measurement of a relationship between the impurity concentration of the P$^+$-type layer 15 and the drain breakdown voltage when the P$^+$-type layer 15 is located at the boundary (the step height portion) between the bottom surface and the side surface of the recess 17. A drain breakdown voltage observed when the P$^+$-type layer 15 is not located at the boundary between the bottom surface and the side surface of the recess 17 is also shown in FIG. 2 for reference.

As shown in FIG. 2, when the P$^+$-type layer 15 is located at the boundary between the bottom surface and the side surface of the recess 17, the drain breakdown voltage is much improved compared to when the P$^+$-type layer 15 is not located. In particular, when the P-type impurity is greater than $3.0 \times 10^{17}$ cm$^{-3}$ or more, the drain breakdown voltage can be higher than 1100V. Therefore, the P-type impurity of the P$^+$-type layer 15 is set greater than $3.0 \times 10^{17}$ cm$^{-3}$ or more so that the drain breakdown voltage can be higher than 1100V. According to the present embodiment, the P$^+$-type layer 15 has the P-type impurity of from $1 \times 10^{18}$ to $5 \times 10^{20}$ cm$^{-3}$ (e.g., $5 \times 10^{18}$ cm$^{-3}$) to ensure a high drain breakdown voltage.

Next, a method of manufacturing the SiC semiconductor device shown in FIGS. 1A and 1B is described with reference to FIGS. 3A, 3B, and 3C and FIGS. 4A, 4B, and 4C. In FIGS. 3A, 3B, and 3C and FIGS. 4A, 4B, and 4C, a portion outside the P-type RESURF layer 20 shown in FIG. 1B is omitted.

Figure 3A:
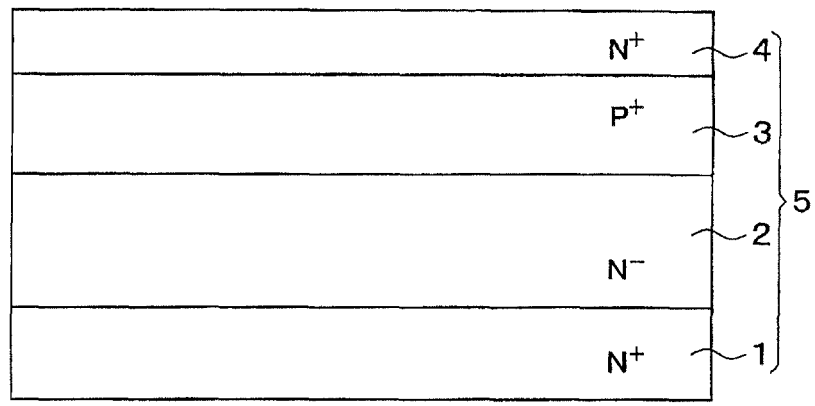
FIGS. 3A, 3B, and 3C illustrate cross-sectional views showing processes of manufacturing the SiC semiconductor device shown in FIGS. 1A and 1B.

(Process Shown in FIG. 3A)

Firstly, the N$^+$-type substrate 1 having the impurity concentration described above is prepared. Then, the N$^-$-type drift layer 2, the P$^+$-type layer 3, and the N$^+$-type layer 4 are formed in turn by epitaxial growth on the surface of the N$^+$-type substrate 1. As a result, the semiconductor substrate 5 is made.

Figure 3B:
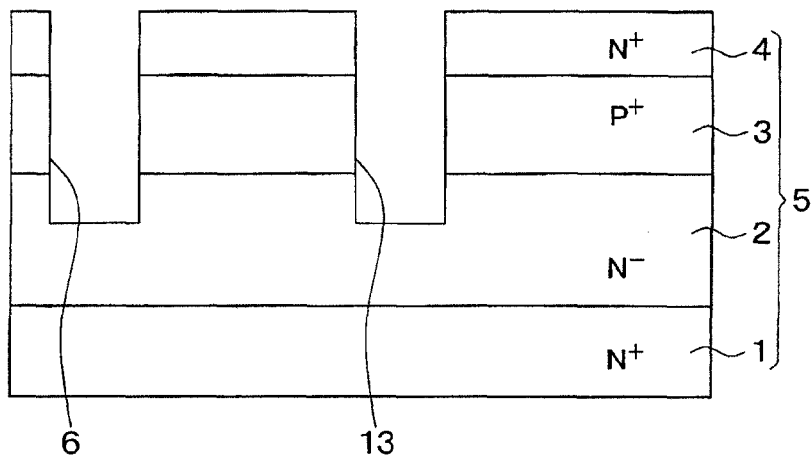

(Process Shown in FIG. 3B)

By photolithography, the trench 6, which reaches the N$^-$-type drift layer 2 by penetrating the N$^+$-type layer 4 and the P$^+$-type layer 3, is formed in the transistor cell region R1 at the same time as the trench 13, which reaches the N$^-$-type drift layer 2 by penetrating the N$^+$-type layer 4 and the P$^+$-type layer 3, is formed in the outer voltage-breakdown-resistant structure region R2. According to the present embodiment, each of the trenches 6 and 13 has the same width and the same depth.

Figure 3C:
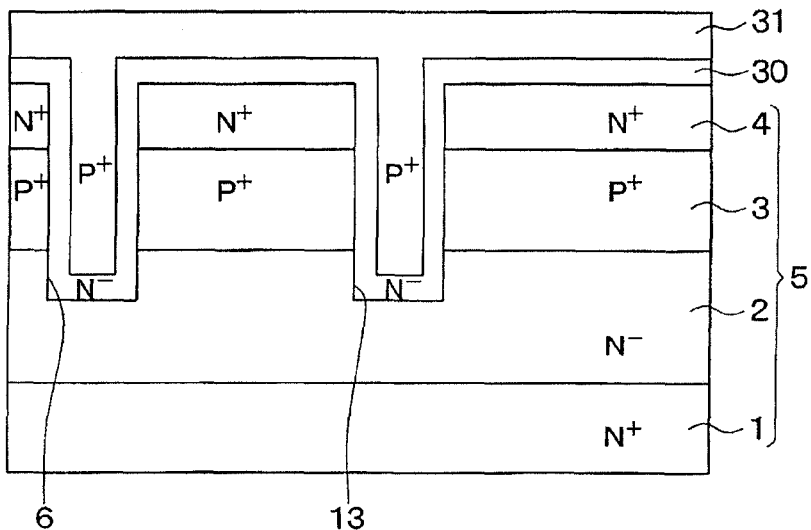

(Process Shown in FIG. 3C)

By epitaxial growth, N$^-$-type SiC and P$^+$-type SiC are epitaxially grown on the entire surface of the semiconductor substrate 5 to form the N$^-$-type layer 30 and the P$^+$-type layer 31 so that the trenches 6 and 7 can be filled with the N$^-$-type layer 30 and the P$^+$-type layer 31.

Figure 4A:
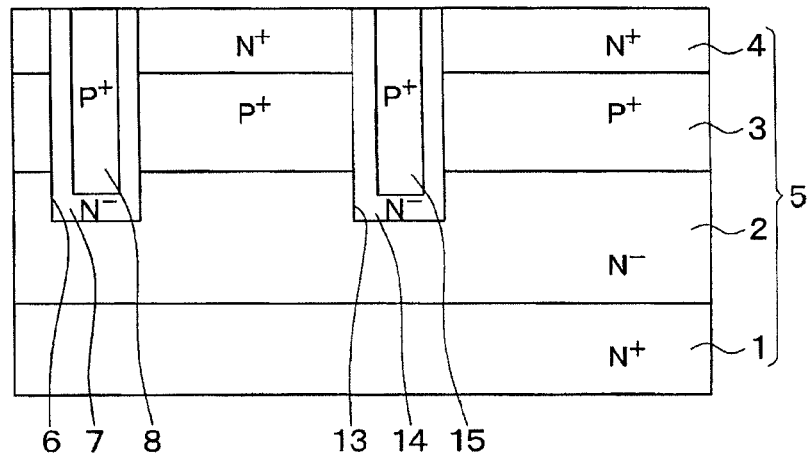
FIGS. 4A, 4B, and 4C illustrate cross-sectional views showing processes of manufacturing the SiC semiconductor device following FIGS. 3A, 3B, and 3C.

(Process Shown in FIG. 4A)

The surface of the semiconductor substrate 5 is planarized by etch-back or CMP (chemical Mechanical Polishing) so that the N$^-$-type layer 30 and the P$^+$-type layer 31 can be left only in the trenches 6 and 13. Thus, the N$^-$-type channel layer 7 and the P$^+$-type layer 8 are formed in the trench 6, and the N$^-$-type layer 14 and the P$^+$-type layer 15 are formed in the trench 13.

Figure 4B:
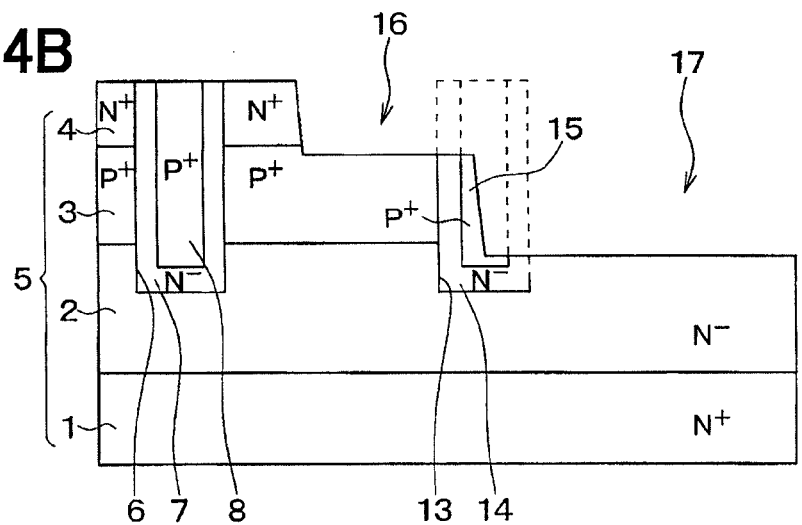

(Process Shown in FIG. 4B)

By anisotropic etching such as RIE (reactive ion etching), an outer edge of the transistor cell region R1 is etched to a depth deeper than the N$^+$-type layer 4, so that the recess 16 is formed. Specifically, the recess 16 is formed by performing anisotropic etching after a mask having an opening corresponding to a formation region of the recess 16 (the outer voltage-breakdown-resistant structure region R2) where the recess 16 is to be formed is placed. Then, by anisotropic etching such as RIE using another mask, the outer edge of the bottom surface of the recess 16 is selectively etched to a depth deeper than the P$^+$-type layer 3, so that the recess 17 is formed. Specifically, the recess 17 is formed by performing anisotropic etching after the other mask having an opening corresponding to a formation region of the recess 17 (a region from a first position where the P-type RESURFE layer 15 is to be formed to a second position outside the first position) where the recess 17 is to be formed is placed. In this way, the mesa structure is formed. At this time, the side surface of the recess 17 is provided by the P$^+$-type layer 15.

Figure 4C:
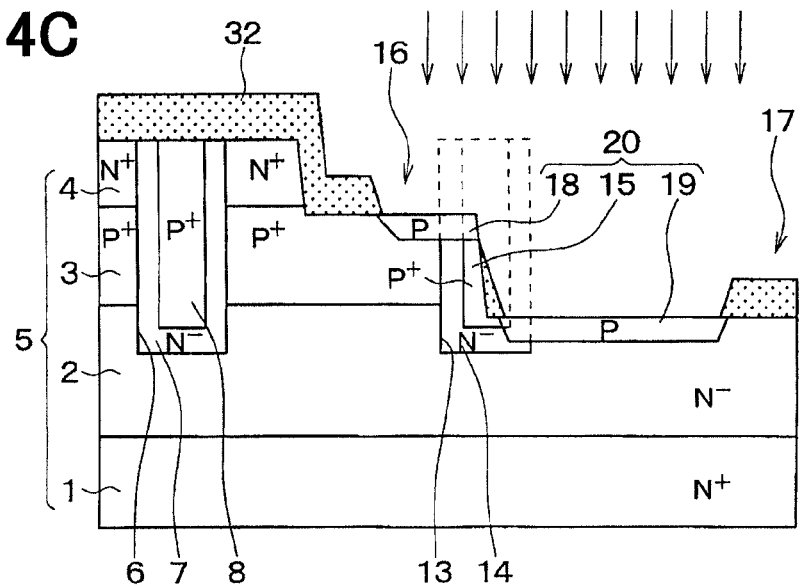

(Process Shown in FIG. 4C)

After a mask 32 for ion implantation is placed, openings corresponding to formation regions of P-type regions 18 and 19 are formed. Then, the P-type regions 18 and 19 are formed by performing ion implantation of P-type impurities in the direction normal to the substrate surface. At this time, since the side surface of the recess 17 is provided by the P$^+$-type layer 15 in the process shown in FIG. 4B, the P-type region 18 on the bottom surface of the recess 16, the P$^+$-type layer 15 in the trench 13, and the P-type region 19 on the bottom surface of the recess 17 are joined together to form the P-type RESURF layer 20.

When the openings are formed in the mask 32, some residue of the mask 32 may be left on the side surface of the recess 17. The residue may block the ion implantation, so that an end of the P-type region 19 may be slightly separated from the corner of the recess 17. However, since the P$^+$-type layer 15 in the trench 13 is also located on the bottom surface of the recess 17, the P$^+$-type layer 15 and the P-type region 19 are continuously joined together.

Although subsequent processes are not shown in the drawings, after the mask 32 is removed, ion implantation of N-type impurities is performed by using a metal mask or the like. Then, the implanted ions are activated, so that the N$^+$-type layer 21 is made. Then, after the interlayer dielectric 11 is formed on the entire surface of the semiconductor substrate 5, contact holes are formed in predetermined regions of the interlayer dielectric 11 and the N$^+$-type layer 4. Then, a wiring layer is formed on the interlayer dielectric 11, and the first gate electrode, the second gate electrode 9, the source electrode 10, and the electrode 22 are formed by patterning the wiring layer. Then, the drain electrode 12 is formed on the back surface side of the semiconductor substrate 5. In this way, the SiC semiconductor device shown in FIGS. 1A and 1B is manufactured.

As described above, in the SiC semiconductor device according to the present embodiment, the P-type region 18 on the bottom surface of the recess 16, the $P^+$-type layer 15 in the trench 13, and the P-type region 19 on the bottom surface of the recess 17 form the P-type RESURF layer 20 for providing the electric field relief structure. Since the P-type RESURF layer 20 surrounds the periphery of the transistor cell region R1, the electric field concentration at the corner which defines the boundary between the side surface and the bottom surface is relieved. Therefore, the breakdown position is shifted to the $N^-$-type drift layer 2 on the bottom surface of the recess 17. Thus, the electric field is relieved so that the drain breakdown voltage can be improved. In particular, according to the present embodiment, the P-type region 18, the $P^+$-type layer 15, and the P-type region 19 are continuously joined together to form the P-type RESURF layer 20. Thus, an ideal drain breakdown voltage at the time of OFF can be ensured.

The P-type RESURF layer 20 can be formed without implanting ions into the side surface of the recess 17 during ion implantation, as long as the P-type regions 18 and 19 are formed on the bottom surfaces of the recess 16 and the recess 17. Therefore, the P-type RESURF layer 20 can be formed without performing the inclined ion implantation. Thus, the outer voltage-breakdown-resistant structure, which surrounds the periphery of the transistor cell region R1 where the JFET is formed, is formed without performing the inclined ion implantation, so that the SiC semiconductor device has a structure for achieving a high drain breakdown voltage. The trench 13, the $N^-$-type layer 14, and the $P^+$-type layer 15 for providing the structure are formed at the same time as the trench 6, the $N^-$-type layer 7, and the $P^+$-type layer 8 for providing the JFET. Since the manufacturing process is commonly used, the structure can be formed without an increase in the manufacturing process.

(Second Embodiment)

A second embodiment of the present disclosure is described. Since the present embodiment is the same as the first embodiment except for a structure of the outer voltage-breakdown-resistant structure region R2, only the difference is described.

Figure 5:
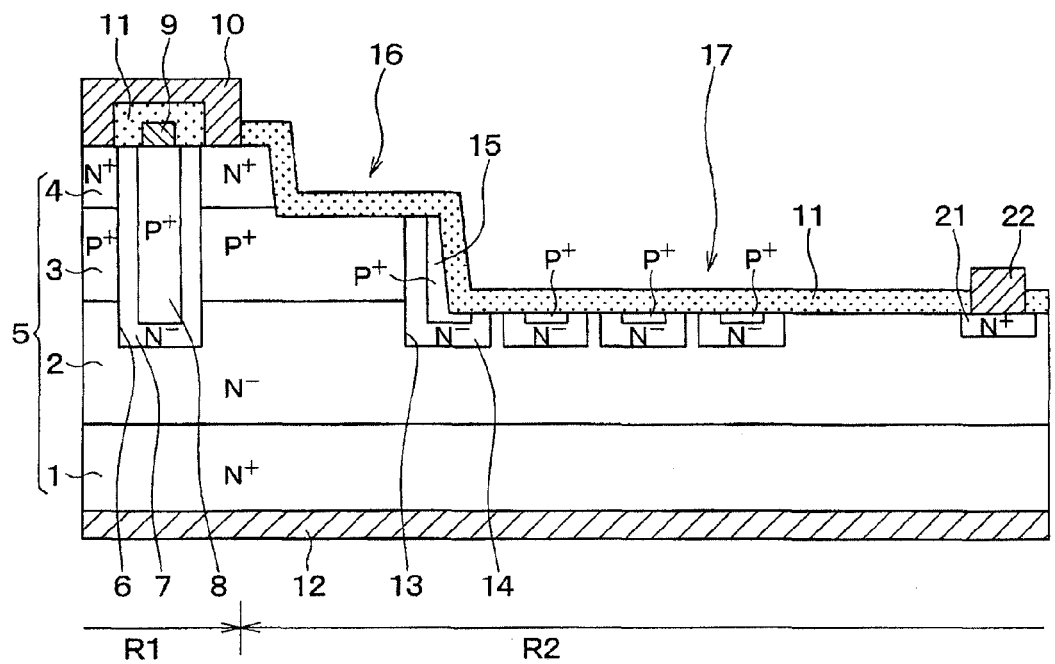
FIG. 5 illustrates a cross-sectional view of a SiC semiconductor device having a JFET according to a second embodiment of the present disclosure.

FIG. 5 is a diagram illustrating a cross-sectional view of a SiC semiconductor device having a JFET according to the present embodiment. As shown in FIG. 5, multiple trenches 13 are formed, and each trench 13 is filled with the $N^-$-type layer 14 and the $P^+$-type layer 15. The innermost trench 13 nearest to the transistor cell region R1 is located at the boundary (at a step height portion) between the bottom surface and the side surface of the recess 17, and the side surface of the recess 17 is provided by the $P^+$-type layer 15 in the innermost trench 13. Although upper potions of the $P^+$-type layers 15 in the other trenches 13 located outside the innermost trench 13 are removed by the recess 17, the remaining portions of the $P^+$-type layers 15 are arranged at regular intervals to provide a guard ring structure.

As described above, according to the present embodiment, the guard ring structure is formed in the outer voltage-breakdown-resistant structure region R2 instead of the P-type RESURF layer 20 of the first embodiment. Even when the guard ring structure is formed, the $P^+$-type layer 15 can be located on the side surface of the recess 17 by using the trench 13, the $N^-$-type layer 14, and the $P^+$-type layer 15. Thus, the same advantages as the first embodiment can be obtained.

Figure 6:
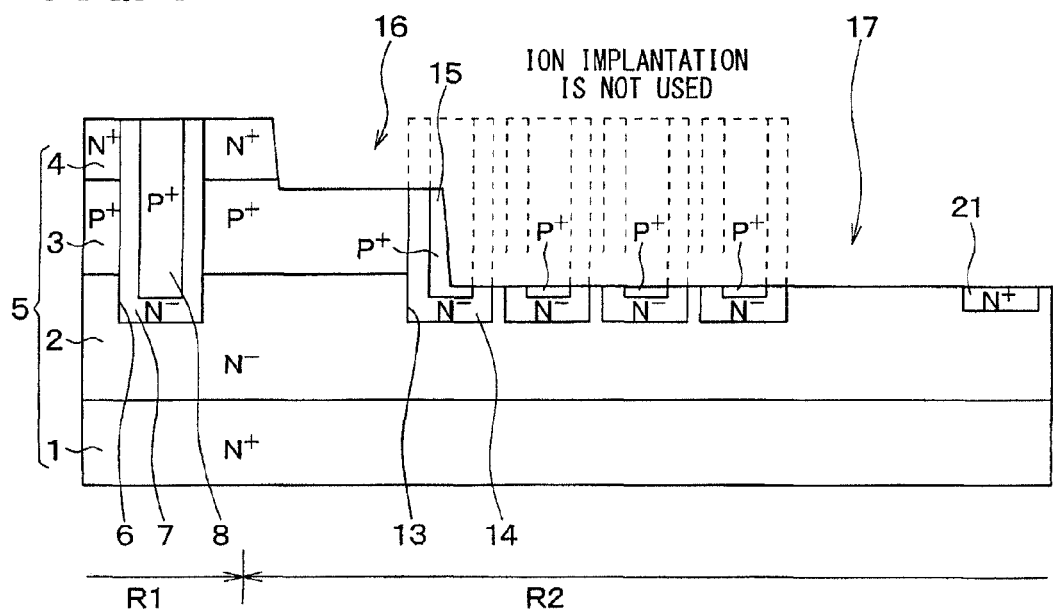
FIG. 6 illustrates a cross-sectional view showing a process of manufacturing the SiC semiconductor device shown in FIG. 5.

A method of manufacturing the SiC semiconductor device according to the present embodiment is almost the same as that described in the first embodiment. As shown in FIG. 6, a difference is that multiple trenches 13 are formed at regular intervals in the process which is described in the first embodiment with reference to FIG. 3B. When multiple trenches 13 are formed at regular intervals in advance, each trench 13 is filled with the $N^-$-type layer 14 and the $P^+$-type layer 15. Then, the recess 16 and the recess 17 are formed by performing selective etching so that the innermost trench 13 nearest to the transistor cell region R1 can be located at the boundary between the bottom surface and the side surface of the recess 17. Thus, the SiC semiconductor device according to the present embodiment is manufactured. As described above, the SiC semiconductor device has the guard ring structure in the outer voltage-breakdown-resistant structure region R2 instead of the P-type RESURF layer 20, and the guard ring structure can be formed without an ion implantation process.

(Third Embodiment)

A third embodiment of the present disclosure is described. Since the present embodiment is the same as the second embodiment except for a shape of the guard ring structure, only the difference is described.

Figure 7:
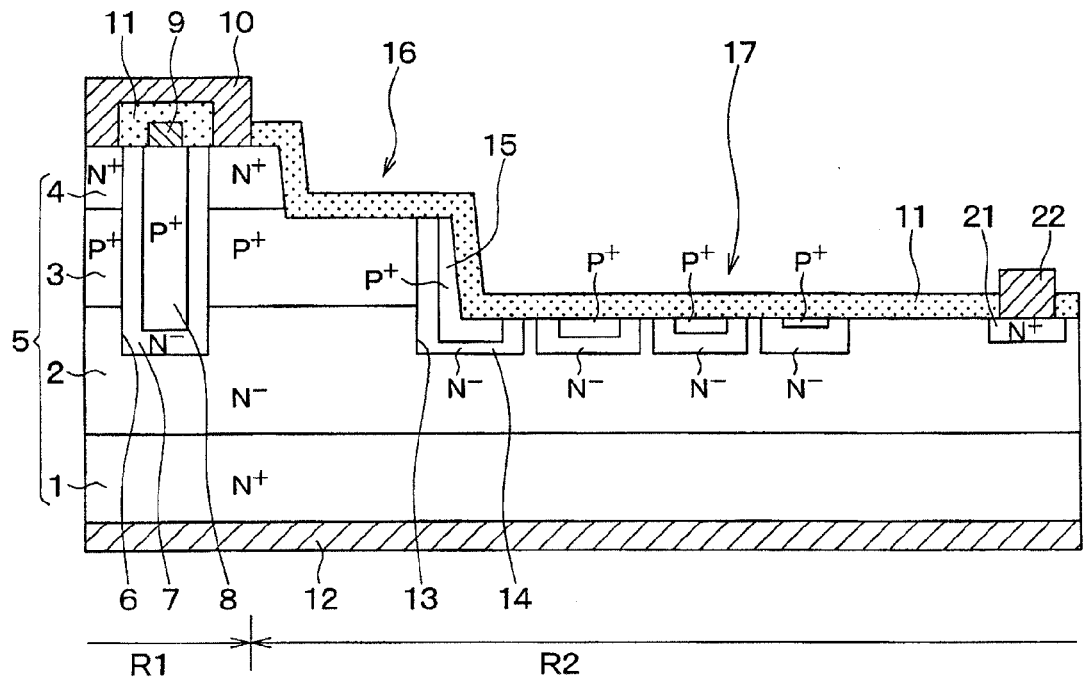
FIG. 7 illustrates a cross-sectional view of a SiC semiconductor device having a JFET according to a third embodiment of the present disclosure.

FIG. 7 is a diagram illustrating a cross-sectional view of a SiC semiconductor device having a JFET according to the present embodiment. As shown in FIG. 7, according to the present embodiment, although the guard ring structure is formed by using the trench 13, the $N^-$-type layer 14, and the $P^+$-type layer 15, the trenches 13 are arranged in descending order of their width in an outward direction. Further, as the trench 13 is narrower, the $N^-$-type layer 14 is thicker so that the $P^+$-type layer 15 on the $N^-$-type layer 14 can be thinner.

Since depths of the $P^+$-type layers 15 continuously decrease, the electric field is further relieved at the time of OFF. Therefore, even when the size of the outer voltage-breakdown-resistant structure region R2 is smaller than that of the second embodiment in which the $P^+$-type layers 15 have the same depth, the same or higher drain breakdown voltage can be ensured.

Figure 8:
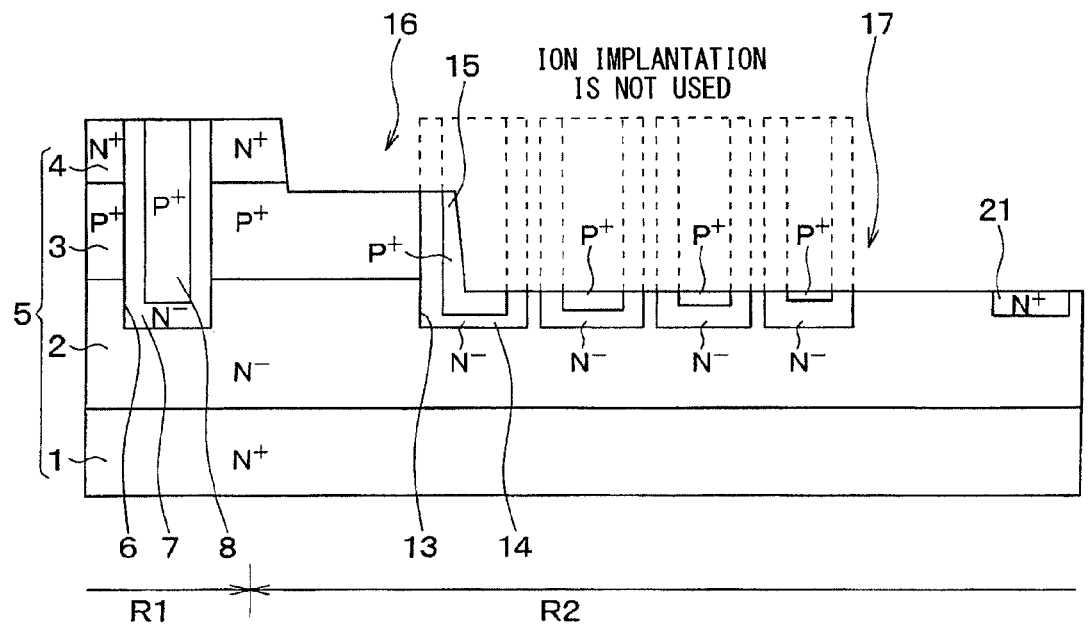
FIG. 8 illustrates a cross-sectional view showing a process of manufacturing the SiC semiconductor device shown in FIG. 7.

A method of manufacturing the SiC semiconductor device according to the present embodiment is almost the same as that described in the second embodiment. As shown in FIG. 8, a difference is that the trenches 13 are arranged in descending order of their width in the outward direction in the process which is described in the first embodiment with reference to FIG. 3B. When the trenches 13 are arranged in descending order of their width in the outward direction in advance, the thickness of the $N^-$-type layer 14 formed on the bottom of the trench 13 changes according to the width of the trench 13. Therefore, as the trench 13 is narrower, the $N^-$-type layer 14 is thicker so that the $P^+$-type layer 15 on the $N^-$-type layer 14 can be thinner. In this way, the SiC semiconductor device according to the present embodiment is manufactured.

(Fourth Embodiment)

A fourth embodiment of the present disclosure is described. Since the present embodiment is the same as the second and the third embodiments except for a shape of the guard ring structure, only the difference is described.

Figure 9:
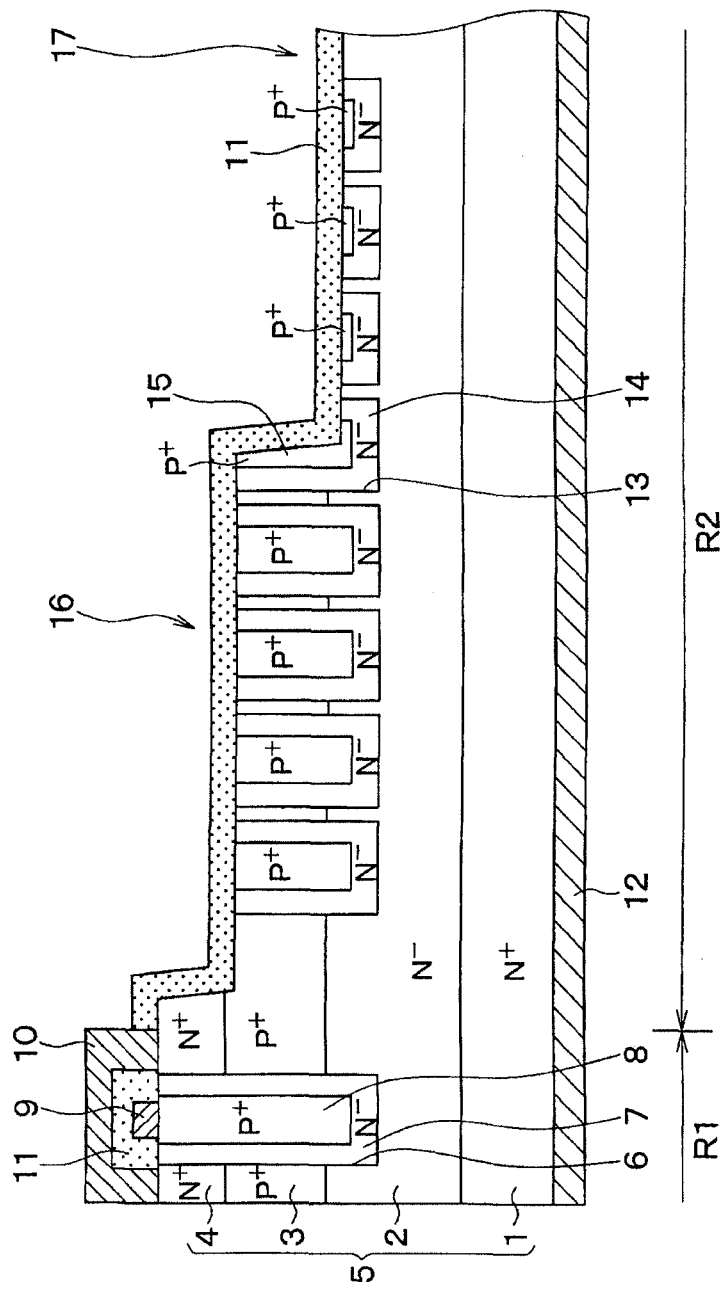
FIG. 9 illustrates a cross-sectional view of a SiC semiconductor device having a JFET according to a fourth embodiment of the present disclosure.

FIG. 9 is a diagram illustrating a cross-sectional view of a SiC semiconductor device having a JFET according to the present embodiment. In the second and third embodiments, the innermost trench 13 out of multiple trenches 13 formed in the outer voltage-breakdown-resistant structure region R2 is located at the boundary (at a step height portion) between the bottom surface and the side surface of the recess 17. However, it is not always necessary that the innermost trench 13 is located at the boundary. For example, as shown in FIG. 9, the Nth trench 13 from the innermost trench 13, where N is a positive integer, can be located at the boundary (at a step height portion) between the bottom surface and the side surface of the recess 17. In other words, at least one trench 13 can be located inside the trench 13 which is located at the boundary between the bottom surface and the side surface of the recess 17.

In the guard ring structure, the $N^-$-type layer 14 and the $N^-$-type drift layer 2, which are located between P-type regions with one inside the other (the $P^+$-type layers 15 in the trenches 13 according to the second and third embodiments and the present embodiments), serve as the electric field relief structure. When the innermost trench 13 out of multiple trenches 13 formed in the outer voltage-breakdown-resistant structure region R2 is located at the boundary (at a step height portion) between the bottom surface and the side surface of the recess 17 like in the second and third embodiments, only the $P^+$-type layers 15 in the recess 17 provides the guard ring structure. Therefore, a distance between adjacent guard ring structures is equal to the sum of the thicknesses of the Krtype layers 14 in adjacent trenches 13 and the width of the $N^-$-type drift layer 2 between adjacent trenches 13.

In contrast, according to the present embodiment, the guard ring structure formed by the trench 13, the $N^-$-type layer 14, and the $P^+$-type layer 15 is also provided in the recess 16 so that the $P^+$-type layer 3 can be located between the trenches 13. Thus, not only the $P^+$-type layers 15 but also the $P^+$-type layer 3 serves as the guard ring structure, and a distance between adjacent guard ring structures is equal to the thickness of the $N^-$-type layers 14 only. Accordingly, electric field in the guard ring structure is reduced so that a stable drain breakdown voltage can be easily ensured.

In FIG. 9, each trench 13 has the same width like in the second embodiment. The same is true for when the trenches 13 are arranged in descending order of their width in the outward direction like in the third embodiment.

(Fifth Embodiment)

A fifth embodiment of the present disclosure is described. Since the present embodiment is the same as the first embodiment except for a transistor formed in the transistor cell region R1, only the difference is described.

Figure 10:
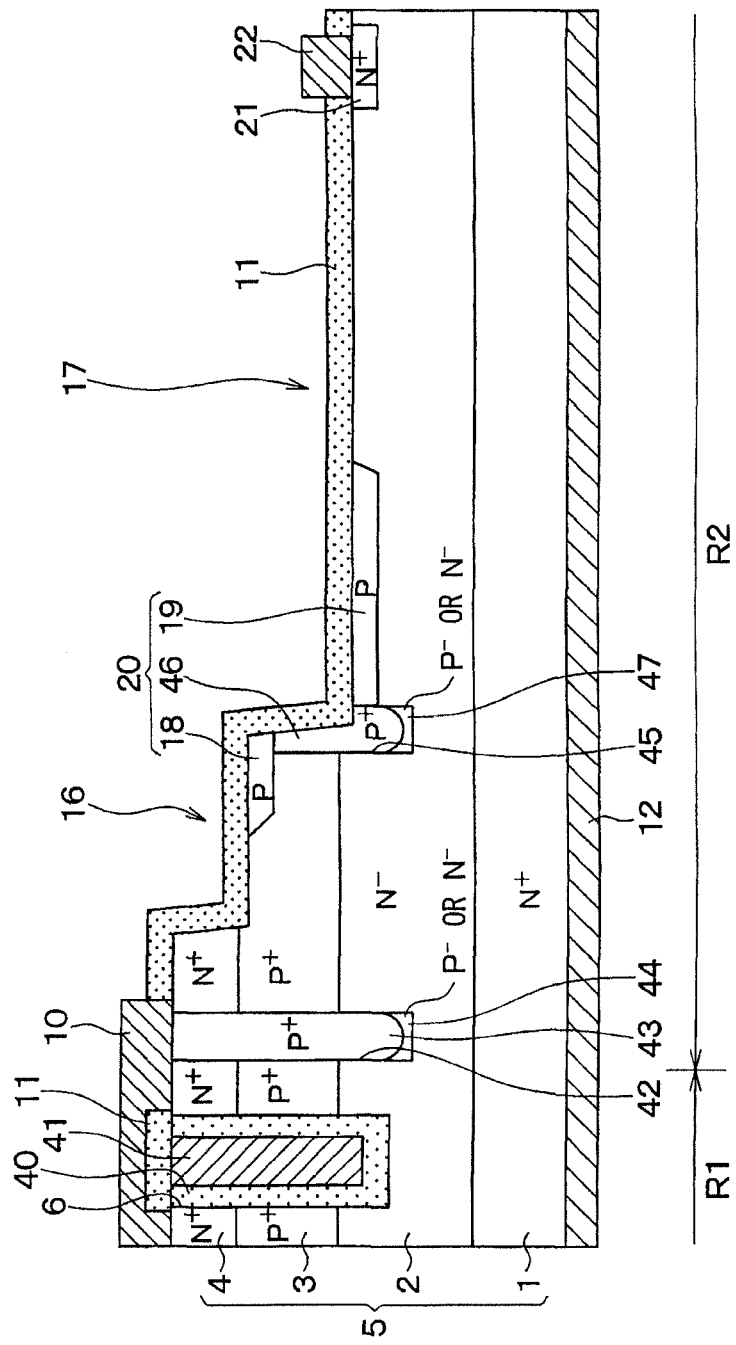
FIG. 10 illustrates a cross-sectional view of a SiC semiconductor device having a MOSFET according to a fifth embodiment of the present disclosure.

FIG. 10 is a diagram illustrating a cross-sectional view of a SiC semiconductor device according to the present embodiment. As shown in FIG. 10, according to the present embodiment, the SiC semiconductor device has a MOSFET with a trench gate structure. Specifically, according to the present embodiment, the SiC semiconductor device is formed by using a semiconductor substrate 5 having a multilayer structure including an $N^+$-type substrate (a first conductivity-type substrate) 1, an $N^-$-type drift layer (a first conductivity-type layer) 2, a $P^+$-type layer (a second conductivity-type layer) 3, and an $N^+$-type layer 4. The $P^+$-type layer 3 serves as a P-type base region for forming a channel region. A gate insulating layer 40 and a gate electrode 41 on surface of the gate insulating layer 40 are formed in the trench 6 instead of the $N^-$-type channel layer 7 and the $P^+$-type layer 8. The trench 6 is filled with the gate insulating layer 40 and the gate electrode 41.

Further, a trench (a second trench) 42, which reaches the $N^-$-type drift layer 2 by penetrating the $N^+$-type layer 4 and the $P^+$-type layer 3, is formed in the transistor cell region R1. The trench 42 is deeper than the trench 6 and separated from a side surface of the trench 6 by a predetermined distance. The trench 42 is filled with a $P^+$-type deep layer 43. Since the trench 42 is deeper than the trench 6, electric field applied to the gate insulating layer 40 at the time of OFF is reduced so that a breakdown of the gate insulating layer 40 can be prevented. A $P^-$-type or $N^-$-type low concentration layer 44 is formed on a bottom of the trench 42 so that a corner of a bottom of the $P^+$-type deep layer 43 can be rounded to reduce electric field concentration. Alternatively, the trench 42 can be filled with the $P^+$-type deep layer 43 only.

The interlayer dielectric 11 covers the gate electrode 41. The source electrode 10 is formed on the interlayer dielectric 11. The source electrode 10 is electrically connected to the $N^+$-type layer 4, which provides a source region, through the contact hole of the interlayer dielectric 11. The source electrode 10 is also electrically connected to the $P^+$-type layer 3, which provides the P-type base region, through the contact hole of the interlayer dielectric 11 and the $P^+$-type deep layer 43. In this way, the MOSFET with the trench gate structure is formed.

A trench (first trench) 45 is formed on the main surface side of the semiconductor substrate 5 in the outer voltage-breakdown-resistant structure region R2. The trench 45 reaches the $N^-$-type drift layer 2 by penetrating the $N^+$-type layer 4 and the $P^+$-type layer 3. The trench 45 surrounds the periphery of the transistor cell region R1 to form a closed loop around the transistor cell region R1. An $P^+$-type layer (a second conductivity type buried layer) 46, which is formed at the same time as the $P^+$-type deep layer 43, and a low concentration layer (a first or second conductivity type buried layer) 47, which is formed at the same time as the low concentration layer 44, are provided in the trench 45.

The trench 45 is located at the boundary (at a step height portion) between the bottom surface and the side surface of the recess 17, and the side surface of the recess 17 is provided by the $P^+$-type layer 46 in the trench 45. Thus, the P-type region 18 on the bottom surface of the recess 16, the $P^+$-type layer 46 in the trench 45, and the P-type region 19 on the bottom surface of the recess 17 are joined together to from the P RESURF layer 20.

As described above, even when the SiC semiconductor device has the MOSFET with the trench gate structure, the side surface of the recess 17 can be provided by the $P^+$-type layer 46 in the trench 45. Thus, the same advantages as the first embodiment can be obtained.

Next, a method of manufacturing the SiC semiconductor device shown in FIG. 10 is described with reference to FIGS. 11A, 11B, and 11C and FIGS. 12A, 12B, and 12C. In FIGS. 11A, 11B, and 11C and FIGS. 12A, 12B, and 12C, a portion outside the P-type RESURF layer 20 shown in FIG. 10 is omitted.

Figure 11A:
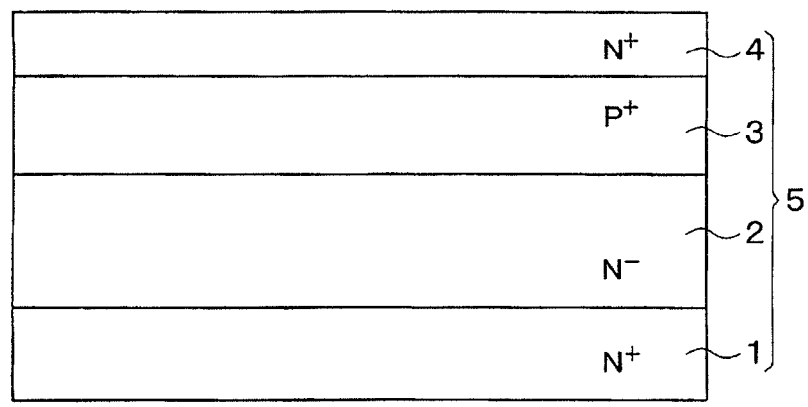
FIGS. 11A, 11B, and 11C illustrate cross-sectional views showing processes of manufacturing the SiC semiconductor device shown in FIG. 10.

(Process Shown in FIG. 11A)

Firstly, the $N^+$-type substrate 1 having the impurity concentration described above is prepared. Then, the $N^-$-type drift layer 2, the $P^+$-type layer 3, and the $N^+$-type layer 4 are formed in turn by epitaxial growth on the surface of the $N^+$-type substrate 1. As a result, the semiconductor substrate 5 is made.

Figure 11B:
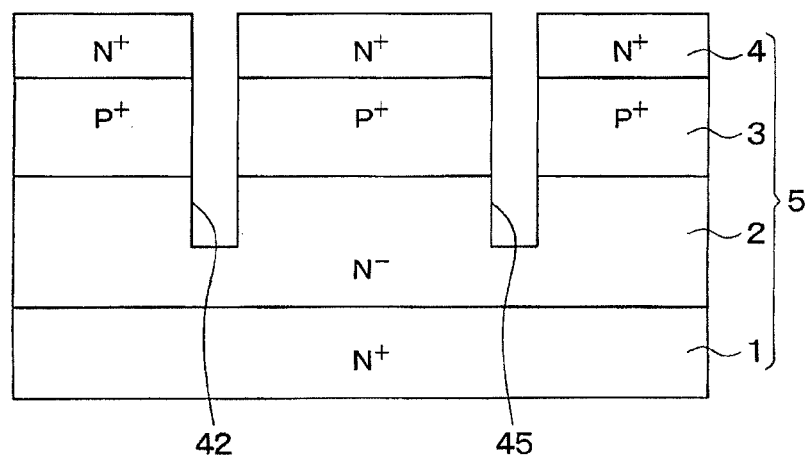

(Process Shown in FIG. 11B)

By photolithography, the trench 42, which reaches the $N^-$-type drift layer 2 by penetrating the $N^+$-type layer 4 and the $P^+$-type layer 3, is formed in the transistor cell region R1 at the same time as the trench 45, which reaches the $N^-$-type drift layer 2 by penetrating the $N^+$-type layer 4 and the $P^+$-type layer 3, is formed in the outer voltage-breakdown-resistant structure region R2. According to the present embodiment, each of the trenches 42 and 45 has the same width and the same depth.

Figure 11C:
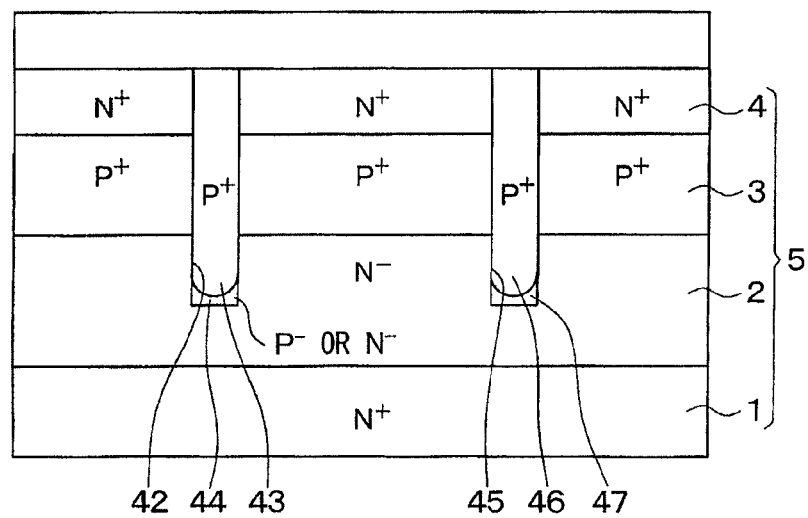

(Process Shown in FIG. 11C)

By epitaxial growth, $P^-$-type or $N^-$-type SiC and $P^+$-type SiC are epitaxially grown on the entire surface of the semiconductor substrate 5 to form the low concentration layers 44 and 47, the $P^+$-type deep layer 43, and the $P^+$-type layer 46 so that the trenches 42 and 45 can be filled with these layers.

Figure 12A:
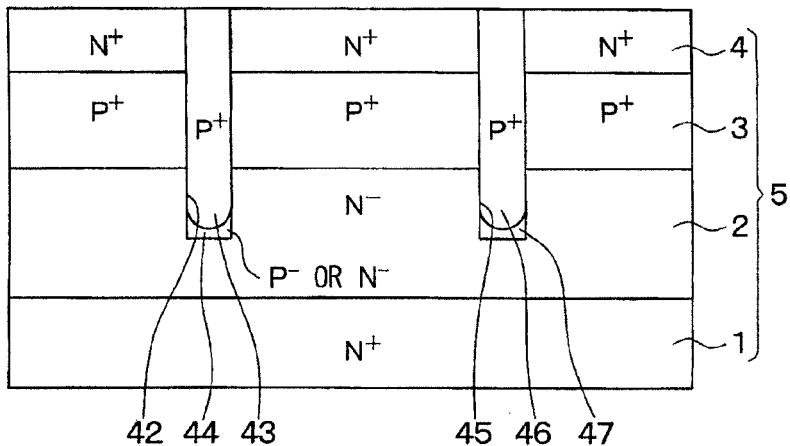
FIGS. 12A, 12B, and 12C illustrate cross-sectional views showing processes of manufacturing the SiC semiconductor device following FIGS. 11A, 11B, and 11C.

(Process Shown in FIG. 12A)

The surface of the semiconductor substrate 5 is planarized by etch-back or CMP (chemical Mechanical Polishing) so that the low concentration layers 44 and 47, the P+-type deep layer 43, and the P+-type layer 46 can be left only in the trenches 42 and 45.

Figure 12B:
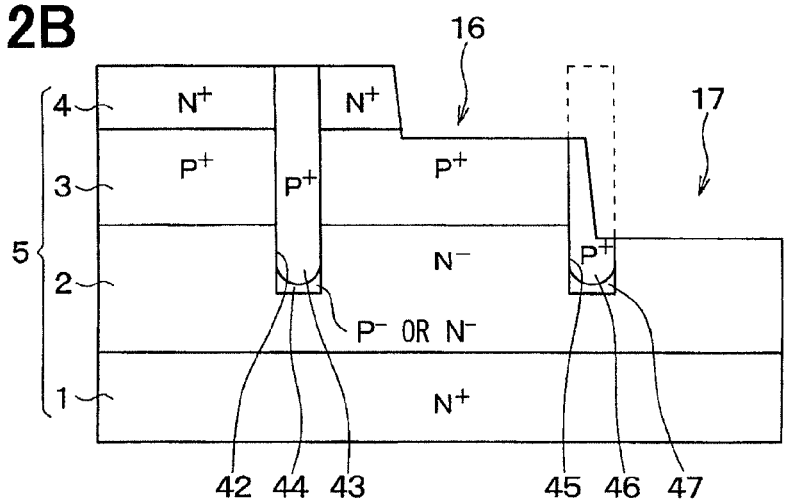

(Process Shown in FIG. 12B)

The recesses 16 and 17 are formed by performing the same process as described in the first embodiment with reference to FIG. 4B. Thus, the mesa structure is formed. At this time, the side surface of the recess 17 is provided by the P+-type layer 46 in the trench 45.

Figure 12C:
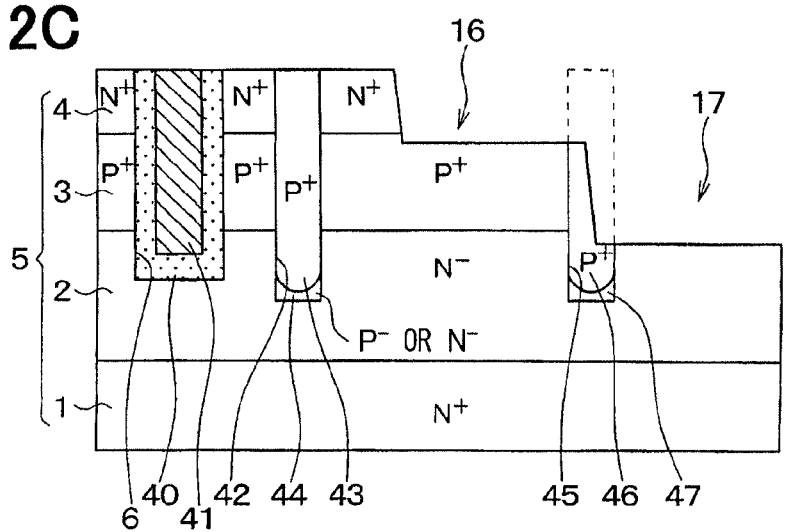

(Process Shown in FIG. 12C)

The trench 6 is formed by performing trench etching after a trench etching mask (not shown) is placed on the entire surface of the semiconductor substrate 5. Then, the gate insulating layer 40 is formed by thermal oxidation. Then, the gate electrode 41 is formed by deposition of doped polysilicon or the like. Then, planarization is formed by etch-back or the like so that the gate electrode 41 can be left in the trench 6.

Although subsequent processes are not shown in the drawings, like in the process shown in FIG. 4C of the first embodiment, after an ion implantation mask having openings corresponding to formation regions of the P-type regions 18 and 19 is placed, ion implantation of P-type impurities is performed in the direction normal to the substrate surface. As a result, the P-type regions 18 and 19 are formed. At this time, since the side surface of the recess 17 is provided by the P+-type layer 46 in the trench 45 in the process shown in FIG. 12B, the P-type region 18 on the bottom surface of the recess 16, the P+-type layer 46 in the trench 13, and the P-type region 19 on the bottom surface of the recess 17 are joined together to form the P-type RESURF layer 20. Then, after the mask is removed, ion implantation of N-type impurities is performed by using a metal mask or the like. Then, the implanted ions are activated, so that the N+-type layer 21 is made. Then, after the interlayer dielectric 11 is formed, contact holes are formed in predetermined regions of the interlayer dielectric 11 and the N+-type layer 4. Then, a wiring layer is formed on the interlayer dielectric 11, and the source electrode 10 and the electrode 22 are formed by pattering the wiring layer. Then, the drain electrode 12 is formed on the back surface side of the semiconductor substrate 5. In this way, the SiC semiconductor device shown in FIG. 10 is manufactured.

As described above, in the SiC semiconductor device according to the present embodiment, the P-type region 18 on the bottom surface of the recess 16, the P+-type layer 46 in the trench 45, and the P-type region 19 on the bottom surface of the recess 17 form the P-type RESURF layer 20. Thus, like in the first embodiment, the drain breakdown voltage can be improved.

The P-type RESURF layer 20 can be formed without implanting ions into the side surface of the recess 17 during ion implantation. Therefore, the P-type RESURF layer 20 can be formed without performing the inclined ion implantation. Thus, the outer voltage-breakdown-resistant structure around the periphery of the transistor cell region R1, where the MOSFET is formed, is formed without performing the inclined ion implantation, so that the SiC semiconductor device has a structure for achieving a high drain breakdown voltage. The trench 45 and the P+-type layer 46 for providing the structure are formed at the same time as the trench 42 and the P+-type deep layer 43 for providing the MOSFET. Therefore, the structure can be formed without an increase in the manufacturing process.

(Sixth Embodiment)

A sixth embodiment of the present disclosure is described. Since the present embodiment is the same as the fifth embodiment except for a structure of the outer voltage-breakdown-resistant structure region R2, only the difference is described.

Figure 13:
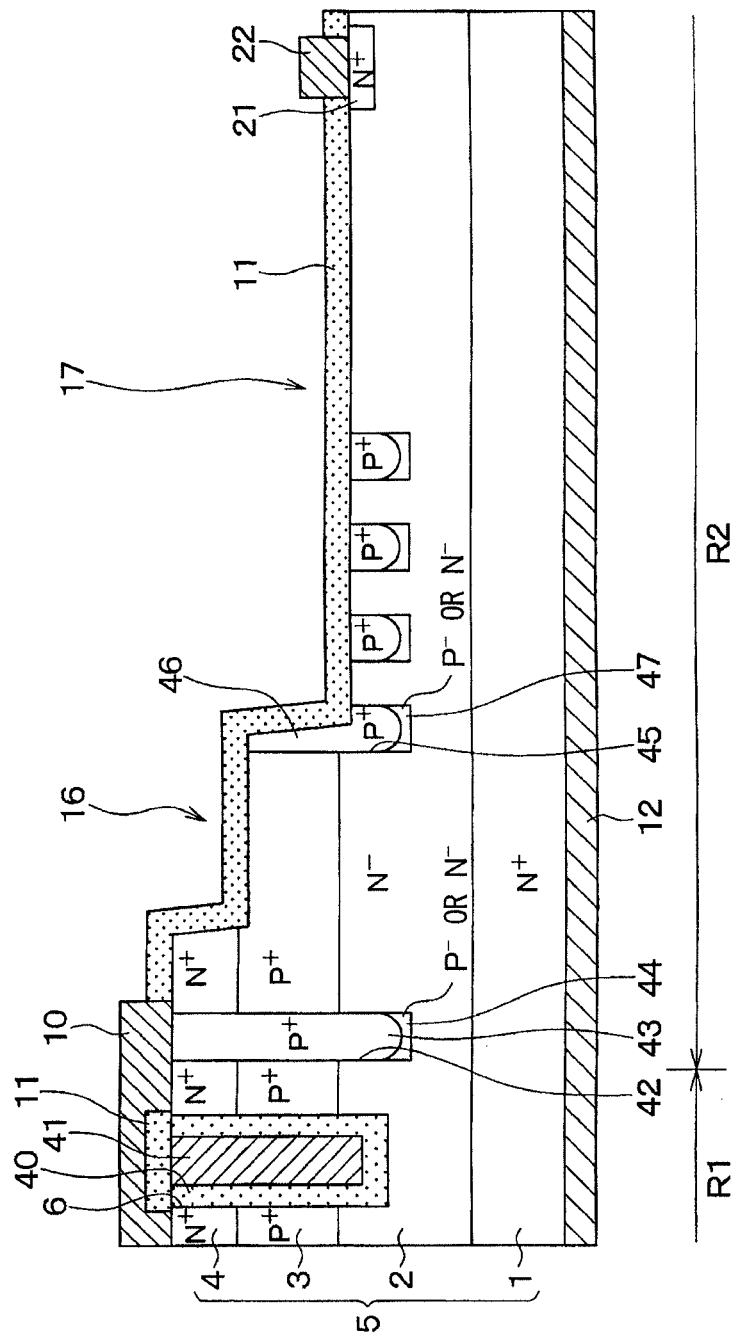
FIG. 13 illustrates a cross-sectional view of a SiC semiconductor device having a MOSFET according to a sixth embodiment of the present disclosure.

FIG. 13 is a diagram illustrating a cross-sectional view of a SiC semiconductor device having a MOSFET according to the present embodiment. As shown in FIG. 13, multiple trenches 45 are formed, and each trench 45 is filled with the low concentration layer 47 and the P+-type layer 46. The innermost trench 45 nearest to the transistor cell region R1 is located at the boundary (at a step height portion) between the bottom surface and the side surface of the recess 17, and the side surface of the recess 17 is provided by the P+-type layer 46 in the innermost trench 45. Although upper potions of the P+-type layers 46 in the other trenches 45 located outside the innermost trench 45 are removed by the recess 17, the remaining portions of the P+-type layers 46 are arranged at regular intervals to provide a guard ring structure.

As described above, according to the present embodiment, the guard ring structure is formed in the outer voltage-breakdown-resistant structure region R2 instead of the P-type RESURF layer 20 of the fifth embodiment. Even when the guard ring structure is formed, the P+-type layer 46 can be located on the side surface of the recess 17 by using the trench 45 and the P+-type layer 46. Thus, the same advantages as the fifth embodiment can be obtained.

Figure 14:
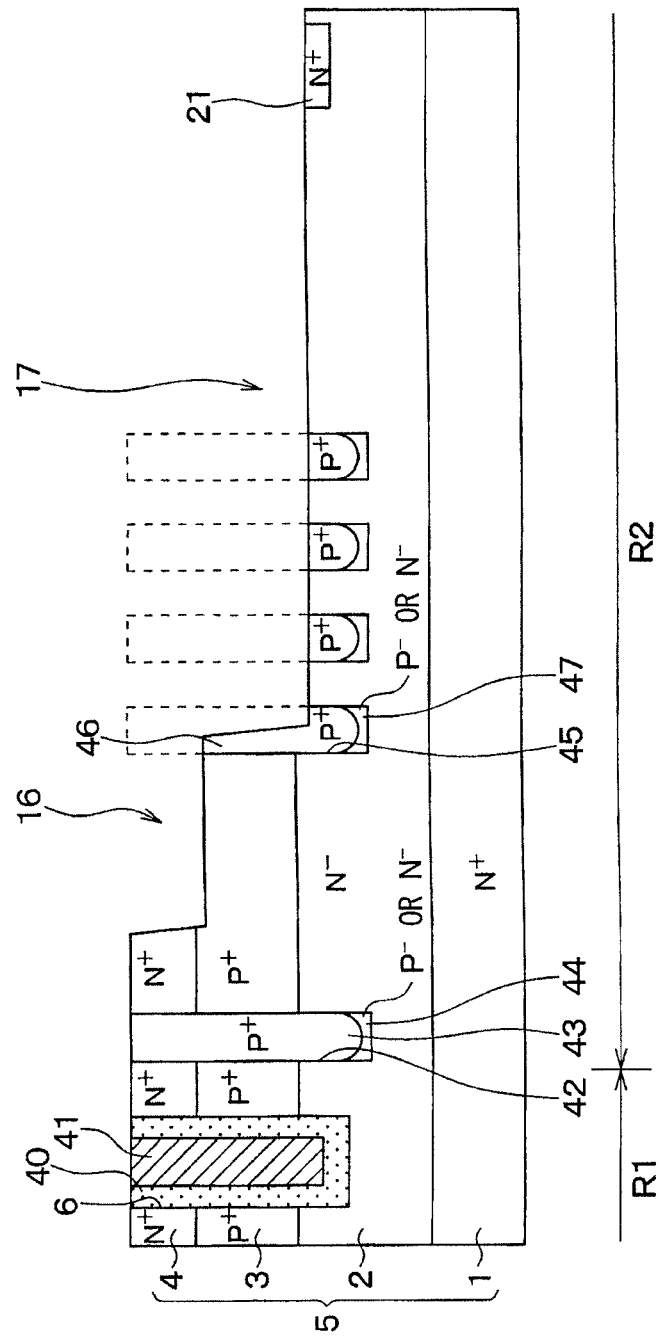
FIG. 14 illustrates a cross-sectional view showing a process of manufacturing the SiC semiconductor device shown in FIG. 13.

A method of manufacturing the SiC semiconductor device according to the present embodiment is almost the same as that described in the fifth embodiment. As shown in FIG. 14, a difference is that multiple trenches 45 are formed at regular intervals in the process which is described in the fifth embodiment with reference to FIG. 11B. When multiple trenches 45 are formed at regular intervals in advance, each trench 45 is filled with the low concentration layer 47 and the P+-type layer 46 by forming the low concentration layer 44 and the P+-type deep layer 43. Then, the recess 16 and the recess 17 are formed by performing selective etching so that the innermost trench 45 nearest to the transistor cell region R1 can be located at the boundary between the bottom surface and the side surface of the recess 17. Thus, the SiC semiconductor device according to the present embodiment is manufactured. As described above, the SiC semiconductor device has the guard ring structure in the outer voltage-breakdown-resistant structure region R2 instead of the P-type RESURF layer 20, and the guard ring structure can be formed without an ion implantation process.

(Seventh Embodiment)

A seventh embodiment of the present disclosure is described. Since the present embodiment is the same as the sixth embodiment except for a shape of the guard ring structure, only the difference is described.

Figure 15:
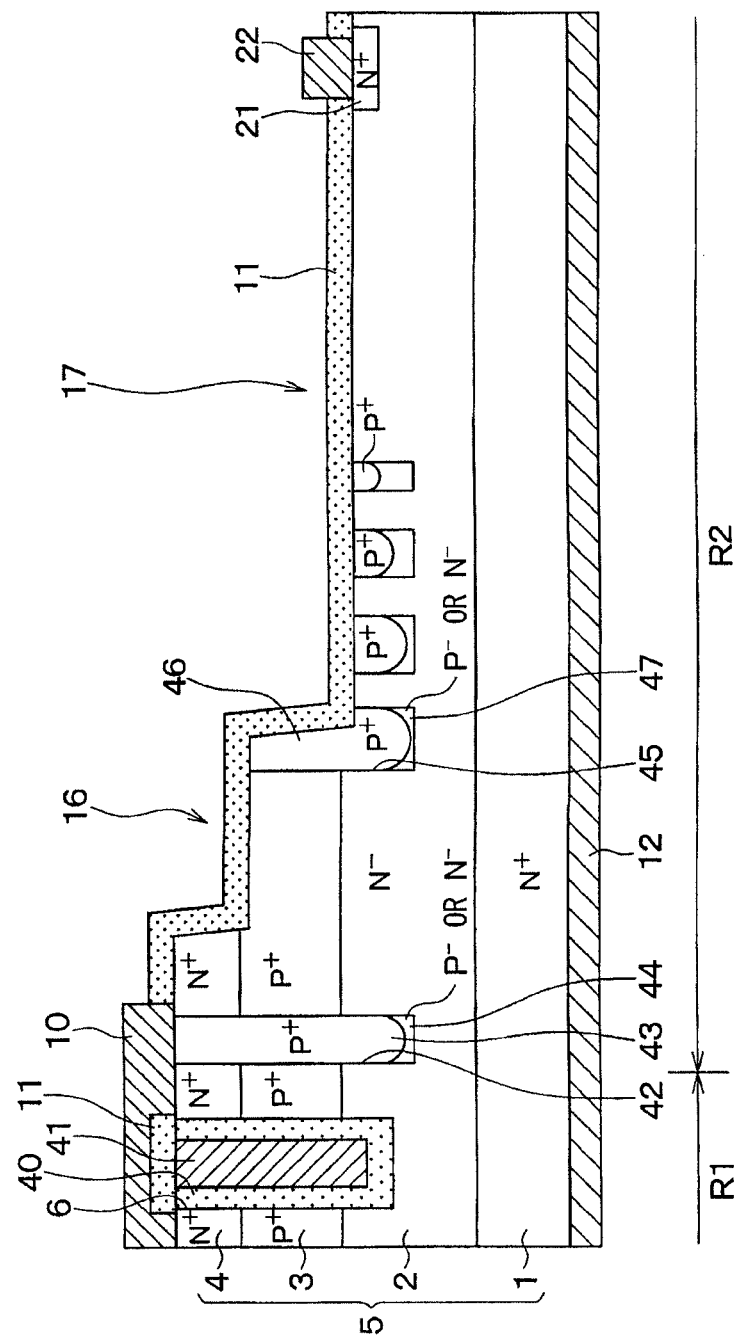
FIG. 15 illustrates a cross-sectional view of a SiC semiconductor device having a MOSFET according to a seventh embodiment of the present disclosure.

FIG. 15 is a diagram illustrating a cross-sectional view of a SiC semiconductor device having a MOSFET according to the present embodiment. As shown in FIG. 15, according to the present embodiment, although the guard ring structure is formed by using the trench 45, the low concentration layer 47, and the P+-type layer 46, the trenches 45 are arranged in descending order of their width in the outward direction. Further, as the trench 45 is narrower, the low concentration layer 47 in the trench 45 is thicker so that the P+-type layer 46 on the low concentration layer 47 can be thinner.

In this structure, the electric field is further relieved at the time of OFF. Therefore, even when the size of the outer voltage-breakdown-resistant structure region R2 is smaller than that of the sixth embodiment in which the P⁺-type layers 46 have the same depth, the same or higher drain breakdown voltage can be ensured.

Figure 16:
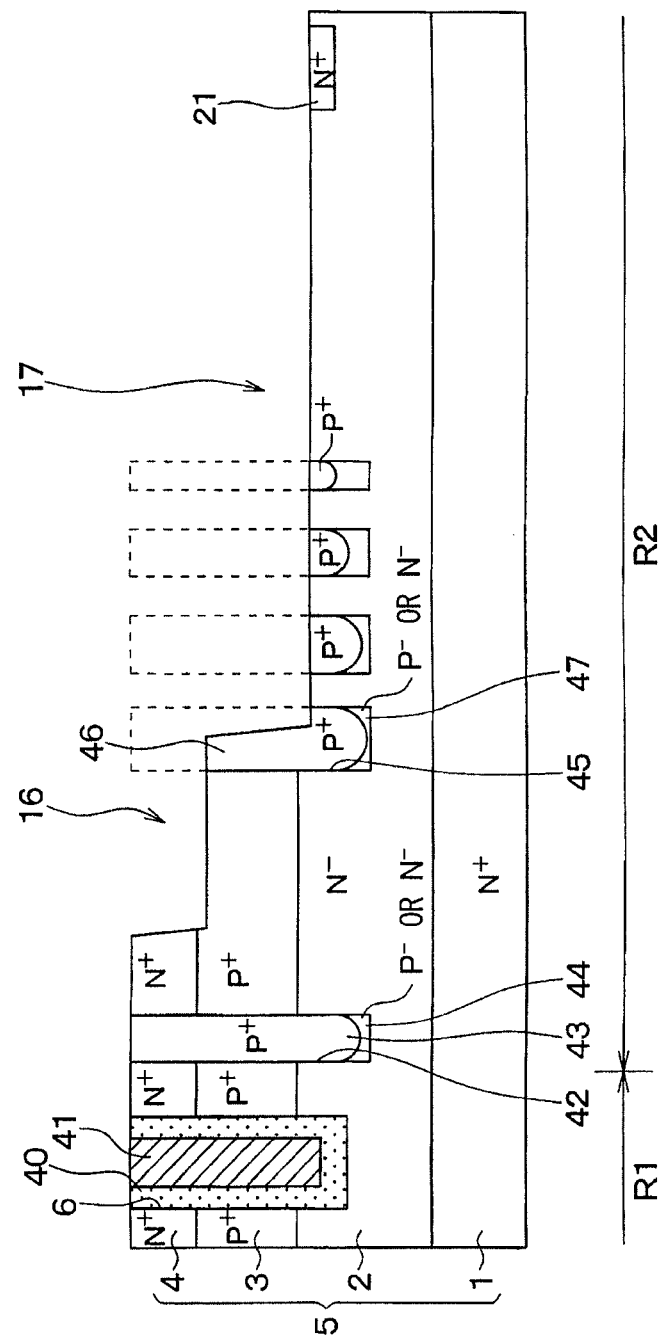
FIG. 16 illustrates a cross-sectional view showing a process of manufacturing the SiC semiconductor device shown in FIG. 15.

A method of manufacturing the SiC semiconductor device according to the present embodiment is almost the same as that described in the sixth embodiment. As shown in FIG. 16, a difference is that the trenches 45 are arranged in descending order of their width in the outward direction in the process which is described in the fifth embodiment with reference to FIG. 11B. When the trenches 45 are arranged in descending order of their width in the outward direction in advance, the thickness of the low concentration layer 47 formed on the bottom of the trench 45 changes according to the width of the trench 45. Therefore, as the trench 45 is narrower, the low concentration layer 47 is thicker so that the P⁺-type layer 46 on the low concentration layer 47 can be thinner. In this way, the SiC semiconductor device according to the present embodiment is manufactured.

(Eighth Embodiment)

An eighth embodiment of the present disclosure is described. Since the present embodiment is the same as the sixth and the seventh embodiments except for a shape of the guard ring structure, only the difference is described.

Figure 17:
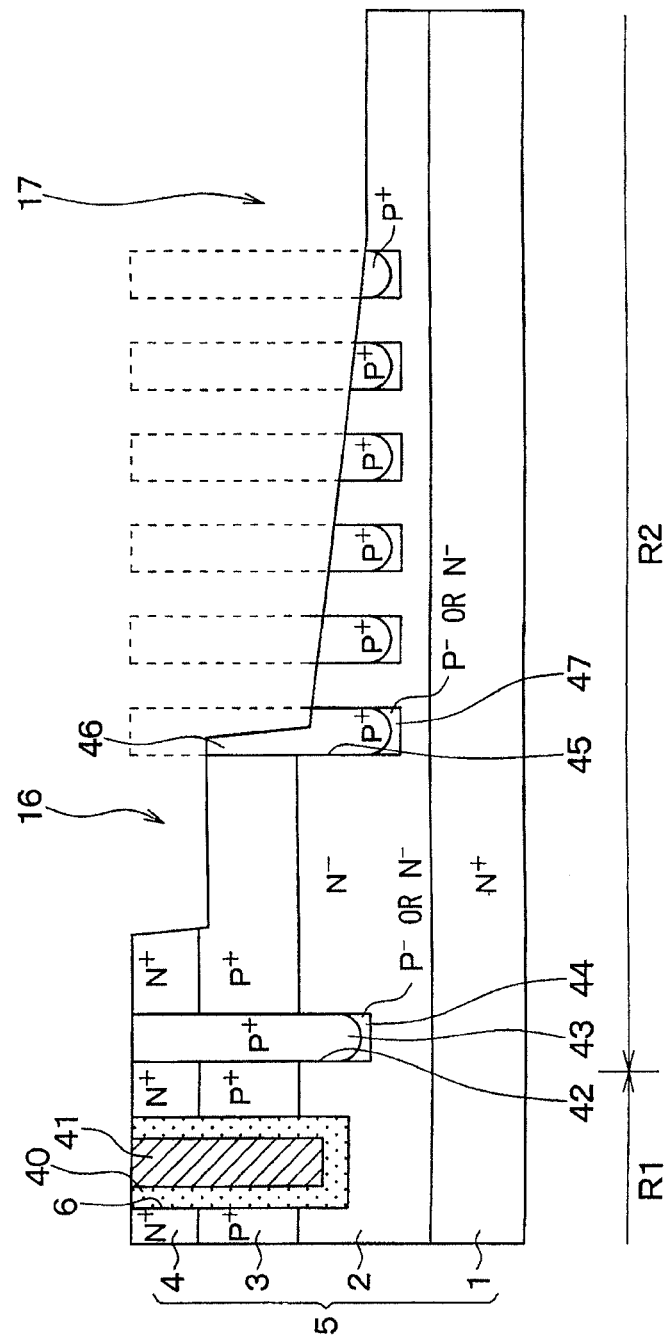
FIG. 17 illustrates a cross-sectional view of a SiC semiconductor device having a MOSFET according to an eighth embodiment of the present disclosure.
Figure 18A:
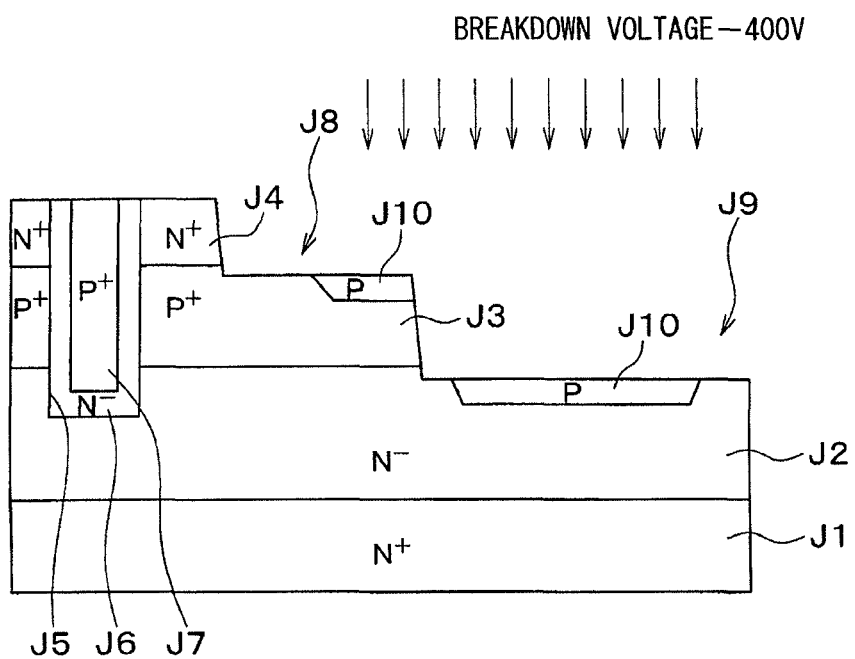
FIGS. 18A and 18B illustrate cross-sectional views showing processes of forming a P-type RESURF layer as an outer voltage-breakdown-resistant structure.
Figure 18B:
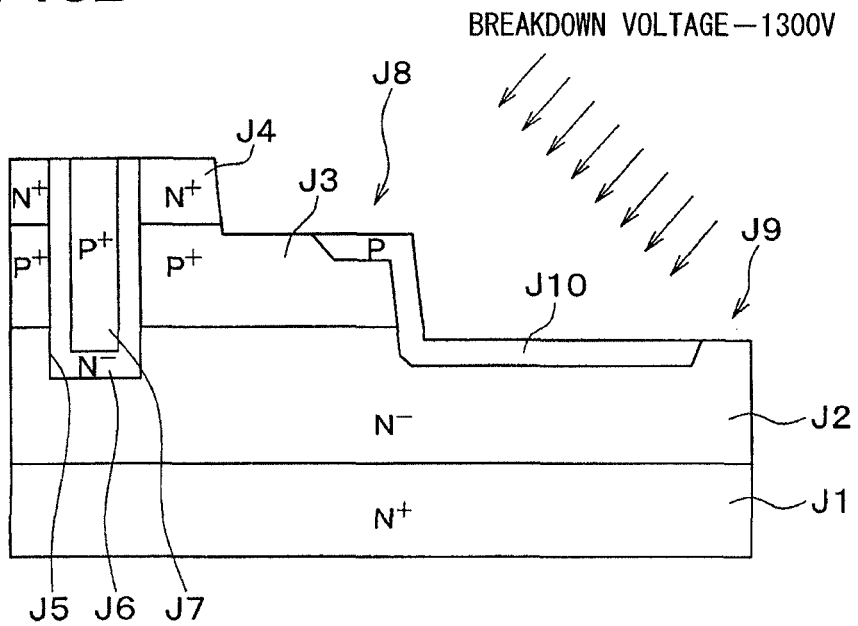

FIG. 17 is a diagram illustrating a cross-sectional view of a SiC semiconductor device having a MOSFET according to the present embodiment. In the sixth and seventh embodiments, the height of the bottom surface of the recess 17 formed in the outer voltage-breakdown-resistant structure region R2 is kept constant. Alternatively as shown in FIG. 17, the height of the bottom surface of the recess 17 can gradually decrease in the outward direction of the transistor cell region R1. Accordingly, the P⁺-type layers 46 of the guard ring structures are arranged in descending order of their height so that the outermost P⁺-type layer 46 can have the smallest height.

When the P⁺-type layers 46 of the guard ring structures are arranged in descending order of their height, the electric field is relieved more effectively. Accordingly, the drain breakdown voltage is further improved.

(Modifications)

While the present disclosure has been described with reference to embodiments thereof, it is to be understood that the disclosure is not limited to the embodiments. The present disclosure is intended to cover various modifications and equivalent arrangements within the spirit and scope of the present disclosure.

In the above embodiments, the electric field relief structure is provided by forming the side surface of the recess 17 at the boundary between the recess 16 and the recess 17 using the P⁺-type layer 15 or 46, and the outer voltage-breakdown-resistant structure is provided by forming the P-type RESURF layer 20 or the guard ring structure using this. The minimum requirement for such an outer voltage-breakdown-resistant structure is to include the electric field relief structure which is provided by forming the side surface of the recess 17 at the boundary between the recess 16 and the recess 17 using the P⁺-type layer 15 or 46. The outer voltage-breakdown-resistant structure can be modified in any way, as long as the minimum requirement is satisfied. For example, the outer voltage-breakdown-resistant structure can be the P-type RESURF layer 20 using the electric field relief structure, the guard ring structure using the electric field relief structure, or a combination of these.

In the above embodiments, an N-channel type JFET in which a channel region is created in the N⁻-type channel layer 7 or an N-channel type MOSFET in which a channel region is created in the P⁺-type layer 3 which provides the P-type base region is described as an example. Alternatively, a P-channel type JFET or MOSFET in which a conductivity type of each component is inverted can be applied to the present disclosure. Although a JEFT or a MOSFET is described as an example of a transistor formed in the transistor cell region R1, another type of transistor can be formed.

In the first embodiment, the JFET is driven by a dual-gate drive in which the source-to-drain current is controlled by controlling the potential of each of the first and second gate regions. Alternatively, the JFET can be driven by a single-gate drive in which the source-to-drain current is controlled by controlling the potential of one of the first and second gate regions.

In the above embodiments, the N⁺-type layer 4, which provides the source region, is formed by epitaxial growth. Alternatively, the N⁺-type layer 4 can be formed by ion implantation of N-type impurities into the first gate region 3. In this case, when the N⁺-type layer 4 is formed at a position separated from the mesa structure, there is no need to form the recess 16. Thus, the mesa structure can be provided by the recess 17 only.

In the SiC semiconductor device having the JFET in the transistor cell region R1 according to the first to fourth embodiments, since the trench 13 corresponding to the first trench and the trench 6 corresponding to the second trench can be formed at the same time, the electric field relief structure such as the P-type RESURF layer 20 or the guard ring structure is formed by using the trench 13 filled with the N⁻-type layers 14 and the P⁺-type layer 15. Likewise, in the SiC semiconductor device having the MOSFET in the transistor cell region R1 according to the fifth to eighth embodiments, since the trench 45 corresponding to the first trench and the trench 42 corresponding to the second trench can be formed at the same time, the electric field relief structure such as the P-type RESURF layer 20 or the guard ring structure is formed by using the trench 42 filled with the P⁺-type layer 42. Alternatively, in the SiC semiconductor device having the JFET, the electric field relief structure such as the P-type RESURF layer 20 or the guard ring structure can be formed by using the trench 42 filled with the P⁺-type layer 42 as described in the fifth to eighth embodiments, or in the SiC semiconductor device having the MOSFET, the electric field relief structure such as the P-type RESURF layer 20 or the guard ring structure can be formed by using the trench 13 filled with the N⁻-type layers 14 and the P⁺-type layer 15.

What is claimed is:

1. A silicon carbide semiconductor device comprising:
   a semiconductor substrate including a first conductivity type substrate, a first conductivity type drift layer on the first conductivity type substrate, a second conductivity type layer on the drift layer, and a first conductivity type layer on the second conductivity type layer;
   a transistor formed in a transistor cell region of the semiconductor substrate; and
   an outer voltage-breakdown-resistant structure formed in an outer voltage-breakdown-resistant structure region which surrounds an outer periphery of the transistor cell region, wherein
   the outer voltage-breakdown-resistant structure formed in an outer voltage-breakdown-resistant structure region includes a first recess which surrounds the outer periphery of the transistor cell region, a first trench located at a side surface of the first recess on an inner periphery of the first recess, and an electric field relief structure having a second conductivity type buried layer, the first recess is deeper than the first conductivity type layer and the second conductivity type layer and reaches the drift layer, the first trench surrounds the outer periphery of the transistor cell region, and the second conductivity type buried layer is buried in the first trench and provides the side surface of the first recess.

2. The silicon carbide semiconductor device according to claim 1, further comprising:

a second recess deeper than a thickness of the first conductivity type layer and surrounding the outer periphery of the transistor cell region, wherein the first recess is located farther away from the transistor cell region than the second recess and deeper than the second recess, and the first trench is located at a boundary between the first recess and the second recess.

3. The silicon carbide semiconductor device according to claim 2, wherein a second conductivity type layer is formed on a near side of a bottom surface of the second recess to the first recess, formed on a near side of a bottom surface of the first recess to the second recess, and joined to the second conductivity type buried layer to form a second conductivity type RESURF layer which provides the electric field relief structure.

4. The silicon carbide semiconductor device according to claim 2, further comprising a plurality of first trenches including the first trench, wherein the plurality of first trenches is arranged outwardly from the boundary between the first recess and the second recess, and the second conductivity type buried layer is buried in each of the plurality of first trenches to form a guard ring structure which provides the electric field relief structure.

5. The silicon carbide semiconductor device according to claim 2, further comprising a plurality of first trenches including the first trench, wherein the plurality of first trenches is arranged inwardly from the boundary between the first recess and the second recess, and the second conductivity type buried layer is buried in each of the plurality of first trenches to form a guard ring structure which provides the electric field relief structure.

6. The silicon carbide semiconductor device according to claim 4, wherein the plurality of first trenches is arranged in descending order of their width in an outward direction of the transistor cell region.

7. The silicon carbide semiconductor device according to claim 1, wherein a JFET is formed in the transistor cell region and includes a first gate region, a source region, a second trench, a first conductivity type channel layer, a second conductivity type second gate region, a source electrode, and a drain electrode, the first gate region is provided by the second conductivity type layer, the source region is provided by the first conductivity type layer, the second trench reaches the drift layer by penetrating the first conductivity type layer and the second conductivity type layer, the channel layer is formed by epitaxial growth on an inner wall of the second trench, the second gate region is formed on the channel layer, the source electrode is electrically connected to the first conductivity type layer, the drain electrode is electrically connected to the first conductivity type substrate, and a source-to-drain current is controlled by controlling a potential of at least one of the first gate region and the second gate region.

8. The silicon carbide semiconductor device according to claim 7, wherein the first trench and the second trench have the same depth, and the second conductivity type buried layer is formed on a first conductivity type buried layer in the first trench.

9. The silicon carbide semiconductor device according to claim 1, wherein a MOSFET is formed in the transistor cell region and includes a base region, a source region, a gate insulating layer, a gate electrode, a source electrode, a drain electrode, a second trench, and a second conductivity type deep layer, the base region is provided by the second conductivity type layer, the source region is provided by the first conductivity type layer, the gate insulating layer is formed on a surface of the base region between the source region and the drift layer, the gate electrode is formed on a surface of the gate insulating layer, the source electrode is electrically connected to the first conductivity type layer, the drain electrode is electrically connected to the first conductivity type substrate, the second trench reaches the drift layer by penetrating the first conductivity type layer and the second conductivity type layer, the second conductivity type deep layer is buried in the second trench, and a source-to-drain current is controlled by controlling a potential of the gate electrode.

10. The silicon carbide semiconductor device according to claim 9, wherein the first trench and the second trench have the same depth.

11. The silicon carbide semiconductor device according to claim 9, wherein another trench is formed in the transistor cell region and reaches the drift layer by penetrating the first conductivity type layer and the second conductivity type layer, the gate insulating layer and the gate electrode are formed in the other trench so that the MOSFET has a trench gate structure, and the other trench of the trench gate structure is deeper than the second trench.

12. A method of manufacturing a silicon carbide semiconductor device, the silicon carbide semiconductor device comprising:

a semiconductor substrate including a first conductivity type substrate, a first conductivity type drift layer on the first conductivity type substrate, a second conductivity type layer on the drift layer, and a first conductivity type layer on the second conductivity type layer;

a transistor formed in a transistor cell region of the semiconductor substrate; and an outer voltage-breakdown-resistant structure formed in an outer voltage-breakdown-resistant structure region which surrounds an outer periphery of the transistor cell region, the method comprising:

a step of preparing the semiconductor substrate;

a step of forming a first trench in the outer voltage-breakdown-resistant structure region in such a manner that the first trench surrounds the outer periphery of the transistor cell region;

a step of forming a second conductivity type buried layer in the first trench and a step of forming a first recess which is deeper than the first conductivity type layer and the second conductivity type layer and reaches the drift layer in such a manner that the first recess surrounds the outer periphery of the transistor cell region, wherein in the step of forming the first recess, the first trench is located at a side surface of the first recess on an inner periphery of the first recess so that the side surface of the first recess is provided by the second conductivity type buried layer to form an electric field relief structure having the second conductivity type buried layer.

13. The method according to claim 12, further comprising:
a step of forming a second recess deeper than a thickness of the first conductivity type layer in such a manner that the second recess surrounds the outer periphery of the transistor cell region, wherein
in the step of forming the first recess, the first trench is located at a boundary between the first recess and the second recess so that the side surface of the first recess at the boundary between the first recess and the second recess is provided by the second conductivity type buried layer to form the electric field relief structure having the second conductivity type buried layer.

14. The method according to claim 13, further comprising:
a step of forming a second conductivity layer on a near side of a bottom surface of the second recess to the first recess and on a near side of a bottom surface of the first recess to the second recess in such a manner that the second conductivity layer is joined to the second conductivity type buried layer to form a second conductivity type RESURF layer which provides the electric field relief structure, wherein
the step of forming the second conductivity layer follows the step of forming the first recess and the step of forming the second recess, and
the step of forming the second conductivity layer includes a step of forming a mask on a surface of the substrate and a step of performing ion implantation of second conductivity type impurities in a direction normal to the substrate by using the mask.

15. The method according to claim 12, wherein
in the step of forming the first trench, a plurality of first trench including the first trench is formed in such manner that the plurality of first trenches is arranged outwardly from the boundary between the first recess and the second recess, and
in the step of forming the second conductivity type buried layer, the second conductivity type buried layer is formed in each of the plurality of first trenches to form a guard ring structure which provides the electric field relief structure.

16. The method according to claim 12, wherein
in the step of forming the first trench, a plurality of first trench including the first trench is formed in such manner that the plurality of first trenches is arranged inwardly from the boundary between the first recess and the second recess, and
in the step of forming the second conductivity type buried layer, the second conductivity type buried layer is formed in each of the plurality of first trenches to form a guard ring structure which provides the electric field relief structure.

17. The method according to claim 15, wherein
in the step of forming the first trench, the plurality of first trenches is formed so that the plurality of first trenches is arranged in descending order of their width in an outward direction of the transistor cell region.

18. The silicon carbide semiconductor device according to claim 12, further comprising:
a step of forming a JFET in the transistor cell region, the JFET having a first gate region provided by the second conductivity type layer and a source region provided by the first conductivity type layer, wherein
the step of forming the JFET includes a step of forming a second trench which reaches the drift layer by penetrating the first conductivity type layer and the second conductivity type layer, a step of forming a first conductivity type channel layer by epitaxial growth on an inner wall of the second trench, a step of forming a second conductivity type second gate region on the channel layer, a step of forming a source electrode electrically connected to the first conductivity type layer, and a step of forming a drain electrode electrically connected to the first conductivity type substrate, and
a source-to-drain current is controlled by controlling a potential of at least one of the first gate region and the second gate region.

19. The method according to claim 18, further comprising:
a step of forming a first conductivity type buried layer in the first trench, wherein
the step of forming the second conductivity type buried layer is performed after the step of forming the first conductivity type buried layer,
the step of forming the first trench and the step of forming the second trench are performed at the same time,
the step of forming the first conductivity type buried layer and the step of forming the channel layer are performed at the same time, and
the step of forming the second conductivity type buried layer and the step of forming the second gate region are performed at the same time.

20. The silicon carbide semiconductor device according to claim 12, further comprising:
a step of forming a MOSFET in the transistor cell region the MOSFET having a base region provided by the second conductivity type layer and a source region provided by the first conductivity type layer, wherein
the step of forming the MOSFET includes a step of forming a second trench which reaches the drift layer by penetrating the first conductivity type layer and the second conductivity type layer, a step of forming a second conductivity type deep layer in the second trench, a step of forming a gate insulating layer on a surface of the base region between the source region and the drift layer, a step of forming a gate electrode on a surface of the gate insulating layer, forming a source electrode electrically connected to the first conductivity type layer, and a step of forming a drain electrode electrically connected to the first conductivity type substrate, and
a source-to-drain current is controlled by controlling a potential of the gate electrode.

21. The method according to claim 20, wherein
the step of forming the first trench and the step of forming the second trench are performed at the same time, and
the step of forming the second conductivity type buried layer and the step of forming the deep layer are performed at the same time.

22. The method according to claim 20, further comprising:
a step of forming another trench in the transistor cell region in such a manner that the other trench is deeper than the second trench and reaches the drift layer by penetrating the first conductivity type layer and the second conductivity type layer, wherein
the gate insulating layer and the gate electrode are formed in the other trench so that the MOSFET has a trench gate structure.

* * * * *